United States Patent [19]

Watanabe et al.

[11] Patent Number: 5,049,967
[45] Date of Patent: Sep. 17, 1991

[54] SEMICONDUCTOR INTEGRATED CIRCUIT DEVICE AND A METHOD FOR MANUFACTURING THE SAME

[75] Inventors: Atsuo Watanabe, Hitachiota; Takahide Ikeda, Tokorozawa; Kiyoshi Tsukuda, Hitachi; Mitsuru Hirao, Ibaraki; Touji Mukai, Sanda; Tatsuya Kamei, Hitachi, all of Japan

[73] Assignee: Hitachi, Ltd., Tokyo, Japan

[21] Appl. No.: 631,907

[22] Filed: Dec. 21, 1990

Related U.S. Application Data

[63] Continuation of Ser. No. 159,956, Feb. 24, 1988, Pat. No. 4,980,744, which is a continuation-in-part of Ser. No. 554,794, Nov. 23, 1983, abandoned.

[30] Foreign Application Priority Data

Nov. 24, 1982 [JP] Japan ................. 57-204671

[51] Int. Cl.⁵ ............................ H01L 27/02
[52] U.S. Cl. ...................... 357/42; 357/43; 357/23.12; 357/48
[58] Field of Search ............. 357/43, 42, 23.12, 48; 307/446

[56] References Cited

U.S. PATENT DOCUMENTS

| | | | |
|---|---|---|---|
| 4,528,581 | 7/1985 | Lee | 357/23.11 |
| 4,719,373 | 1/1988 | Masuda et al. | 307/446 |
| 4,724,221 | 2/1988 | Jochems | 437/54 |
| 4,760,293 | 7/1988 | Hebenstreit | 307/446 |
| 4,829,201 | 5/1989 | Masuda et al. | 307/446 |

FOREIGN PATENT DOCUMENTS

| | | |
|---|---|---|
| 0052450 | 5/1982 | European Pat. Off. |
| 57-186353 | 2/1983 | Japan |
| 2075257 | 11/1981 | United Kingdom |

OTHER PUBLICATIONS

Panills, L. C. et al., "Turn-Tub CMOS: A Technology for VLSI Circuits" IEDM 1980 752–755.

Primary Examiner—Andrew J. James
Assistant Examiner—Sara W. Crane
Attorney, Agent, or Firm—Antonelli, Terry, Stout & Kraus

[57] ABSTRACT

An improved arrangement is provided for forming a bipolar transistor on a substrate with CMOS elements. All of the transistors (i.e., the bipolar, P-MOS and N-MOS) are formed in regions having gradually decreasing impurity concentrations from a surface toward the substrate. In addition, a buried layer is provided under each of the regions of decreasing impurity concentration in which the transistors are formed. These buried layers have a significantly higher impurity concentration than the portion of the region of decreasing impurity concentration which they are respectively adjacent to. Using this arrangement, punch-through is prevented and excellent electrical operating characteristics are provided for both the bipolar transistors and the CMOS elements.

52 Claims, 19 Drawing Sheets

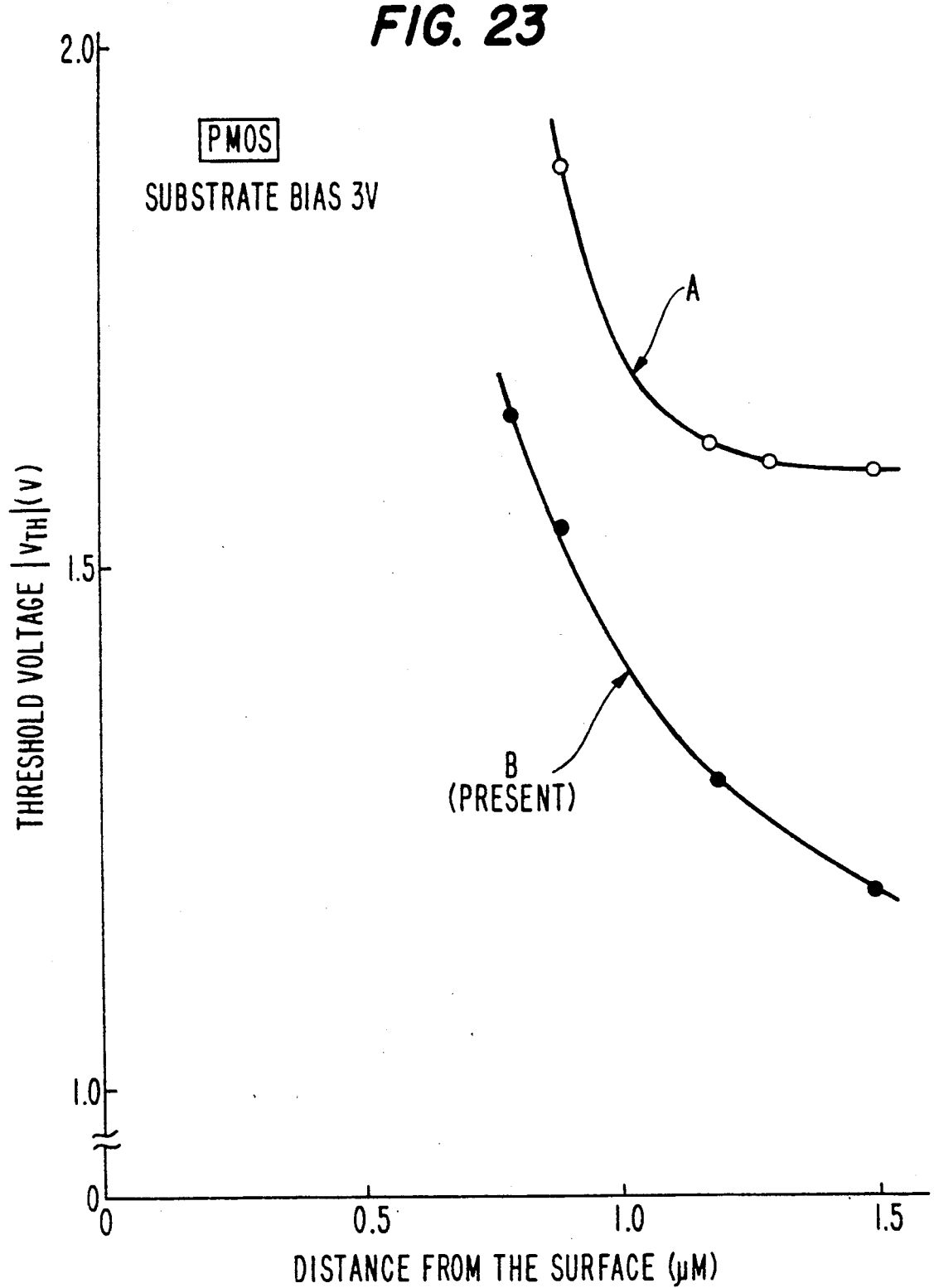

SEMICONDUCTOR INTEGRATED CIRCUIT DEVICE AND A METHOD FOR MANUFACTURING THE SAME

This is a continuation of application Ser. No. 159,956, filed Feb. 24, 1988, now U.S. Pat. No. 4,980,744, which is a continuation-in-part application of Ser. No. 554,794, filed Nov. 23, 1983, now abandoned.

The present invention relates to a semiconductor integrated circuit device and a method for manufacturing the same, and more particularly to a semiconductor integrated circuit device having a plurality of semiconductor elements such as bipolar transistors and MOS (metal-oxide-semiconductor) transistors formed in areas of different conductivities in one substrate, and a method for manufacturing the same.

A semiconductor integrated circuit device having different semiconductor elements such as bipolar transistors and complementary MOS transistors (CMOS transistors having both P-channel and N-channel) formed on one semiconductor substrate (hereinafter referred to as Bi CMOS LSI) has been proposed since 1969 (IEEE Trans. Electron Devices, Vol. ED-16, No. 11, pages 945-951, November 1969).

The Bi CMOS LSI has advantages of a high speed and a high power drivability of the bipolar integrated circuit and advantages of a high integration and low power consumption of the CMOS integrated circuit.

FIG. 1 shows a sectional view of a prior art Bi CMOS LSI. In FIG. 1, a vertical NPN transistor and a CMOS transistor are shown. An N+ (highly doped N-type) buried layer 2 is formed on a surface of a P−-type semiconductor substrate 1, and an N− (low doped N-type) epitaxial layer 10 is formed thereon. The NPN transistor 70 comprises a P-type base layer 3 formed by selectively diffusing a P-type impurity from a surface of the N− epitaxial layer 10, and an N-type emitter layer 4 buried in the P-type base layer 3. The CMOS transistor 60 is formed on the N+ buried layer 2 as is the NPN transistor 70. An NMOS section 61 comprises a P well region 5 formed by diffusing a P-type impurity, N-type source and drain regions 6 in the P well region 5, and a gate electrode 8 having a thin oxide film 7 (gate oxidation film) formed on a surface of the P well region 5. A PMOS section 62 comprises P-type source and drain regions 9, a gate oxidation film 7 and a gate electrode 8 formed on the surface of the N−-type epitaxial layer 10.

In FIG. 1, the P+ (highly doped P-type) diffusion layer 20 functions to electrically isolate the N− layer 10 which is the collector of the NPN transistor 70 from the P−-type silicon substrate and from the N31 layer 10 of the adjacent semiconductor element. FIG. 2 shows a CMOS inverter circuit which is a basic logic circuit. As shown in FIG. 2, the N− layer of the PMOS 62 is fixed to a highest potential $V_{DD}$ (positive potential). To this end, it is necessary to electrically isolate the N− layer from the P−-type substrate 1. Accordingly, the P+ diffusion layer 20 surrounds the N− epitaxial layer 10 of the CMOS 60 and is isolated from the P− substrate 1.

FIG. 3 shows a block diagram of a conventional circuit configuration when the Bi CMOS LSI of the structure described above is applied to a gate array.

The CMOS logic circuit occupies a center area (portion A) of the LSI chip and an I/O buffer of a bipolar circuit is located in the periphery (portion B).

The CMOS logic circuit is isolated from the substrate 1 by the P+ diffusion layer 20 which surrounds the said circuit. Thus, an isolating PN junction 100 occupies a fairly large area.

This structure has a problem of the large area for the PN junction for isolating the CMOS circuit. The larger the PN junction area is, the more it is affected by a distortion and a defect caused during a manufacturing process. Thus, a manufacturing yield is lowered by deterioration of the PN junction.

A structure shown in FIG. 4 has been proposed to resolve the above problem (1981 IEEE, Proc. of the 1981 Custom Integrated Circuit Conference, pages 8-12, May 1981).

In this structure, an isolating P-type diffusion layer 30 is formed around the N−-type substrate 10 of the PMOS section 62 to reduce the isolating PN junction area. Since the isolation of the entire CMOS circuit by one large PN junction is avoided, the manufacturing yield is improved.

However, in the structure of FIG. 4, since the isolating P-type diffusion layer 30 and the P well 5 which serves as a substrate of the NMOS section 61 are separately formed for each PMOS section 62, the integration density of the CMOS circuit is remarkably reduced.

A structure shown in FIGS. 5a-5h has also been known (Japanese Laid-Open Patent Application 57-75453). FIG. 5a shows a P-type silicon substrate 1 having a plane orientation of (100) and a resistivity of 10-20 Ω-cm. $N^{30}$ island regions 2 are formed on surface of the substrate 1 by a conventional selective diffusion method. Then, P+-type island regions 40 and 101 are formed to form isolation junctions and P wells (FIG. 5b).

An N-type epitaxial layer 10 having a resistivity of 4-5 Ω-cm is grown thereon to a thickness of approximately 10 μm. In this step, the N-type and P-type island regions 2, 40 and 101 are buried in the epitaxial layer 10 to form buried layers (FIG. 5c).

A P-type island region 5 for the formation of the P well and an N+-type island region 102 for forming a collector lead region are formed on the surface of the epitaxial layer 10 by a selective diffusion method or an ion implantation method. Numeral 103 denotes a silicon dioxide ($SiO_2$) layer formed in this step by the oxidization of the surface of the epitaxial layer 10 (FIG. 5d).

Then, at a position corresponding to the buried layer 40 under the epitaxial layer 10, a P-type impurity is introduced to form P-type island regions 30. In the following drive-in step, the P-type isolations 30 and 40, the P well 5 and the N-type collector lead region 102 are formed (FIG. 5e).

In this step, all of the regions in which the respective elements are to be formed are defined. In FIG. 5e, the region I surrounded by the isolations 30 and 40 is a region for an NPN bipolar transistor, the region II defined by the isolations 30 and 40 and the P well 5 is a region for a PMOS, and the region III or the P well 5 is a region for an NMOS.

Then, an N-type impurity is introduced by the selective diffusion method or the ion implantation method to form source and drain regions 6 of the NMOS and a N-type channel stopper 104 of the PMOS (FIG. 5f), and a P-type impurity is introduced to form a base region 3 of the NPN transistor and source and drain regions 9 of the PMOS and a P-type channel stopper 105 of the NMOS (FIG. 5g).

Then, gate oxidization films 7, poly-silicon electrodes 8 and aluminum electrodes 106 are formed to complete the NMOS 61, the PMOS 62 and the NPN transistor 70.

In the method of FIGS. 5a-5h, since the PMOS 62 is formed in the N⁻ epitaxial layer 10 having a substantially uniform impurity concentration distribution as is done in the structure of FIG. 4, a threshold voltage Vth of the PMOS 62 is uniquely determined by the surface impurity concentration. Thus, the threshold voltage Vth of the NMOS 61 is affected by the density of the N⁻ epitaxial layer 10, and it is hard to control the threshold voltage.

Further, the prior art as shown in FIG. 5 has a second problem as described below. Namely, a semiconductor element cannot be formed on the surface of the regions IV between the P+ buried regions 40 and 101 and the N+ buried region because of punch-through to the substrate 1. This leads to the reduction of the integration density.

The problem of punch-through will be described in more detail.

FIG. 5i shows an imaginary case where a P channel MOS FET is formed in the region IV between the P+ type buried layer 101 and the N+ type buried layer 2. The edge of the depletion region around the drain and the source junctions is shown by a broken line. Due to the absence of the N+ buried layer 2, the depletion region around the drain junction will grow deep and reach the P⁻ type substrate 1, and causes punch-through. Then, the drain will be electrically connected to the substrate. A high breakdown voltage cannot be obtained for this P-MOS FET. This problem of punch-through becomes more severe as the N⁻ epitaxial layer 10 becomes thinner.

The above problems are encountered not only in the Bi CMOS LSI but also in a semiconductor integrated circuit device in which a plurality of semiconductor devices such as a vertical NPN transistor and a vertical PNP transistor, a lateral NPN transistor and a lateral PNP transistor, or a PNPN thyristor and a vertical PNP transistor are formed in regions of different conductivity types in one substrate. The problems are remarkable particularly in the Bi CMOS LSI.

It is an object of the present invention to provide a semiconductor integrated circuit device and a method for manufacturing the same, which device has a plurality of semiconductor elements formed in regions of different conductivity types in one substrate, a high integration density and excellent electrical characteristics.

In order to achieve the above object, in accordance with one aspect of the present invention, there is provided a semiconductor integrated circuit device comprising:

a semiconductor layer of a predetermined conductivity type formed on a semiconductor substrate of a first conductivity type;

a first well region of a second conductivity type formed at a predetermined position on a surface of said semiconductor layer, an impurity concentration of said first well region gradually decreasing as it goes from the surface of said semiconductor layer toward said semiconductor substrate;

a second well region of the first conductivity type formed in contact with said first well region on the surface of said semiconductor layer and to surround said first well region, an impurity concentration of said second well region gradually decreasing as it goes from the surface of said semiconductor layer toward said semiconductor substrate;

a first buried region of the second conductivity type formed between and adjacent to said first well region and said semiconductor substrate, said first buried region having a higher impurity concentration than the adjacent first well region; a second buried region of the first conductivity type formed between and adjacent to said second well region and said semiconductor substrate, said second buried region having a higher impurity concentration than the adjacent second well region; and semiconductor elements formed in said first well region and said second well region.

In accordance with a second aspect of the present invention, there is provided a semiconductor integrated circuit device comprising;

a semiconductor layer of a predetermined conductivity type formed on a semiconductor substrate of a first conductivity type;

a first well region of a second conductivity type formed at a predetermined position on a surface of said semiconductor layer, an impurity concentration of said first well region gradually decreasing as it goes from the surface of said semiconductor layer toward said semiconductor substrate;

a second well region of the first conductivity type formed at different position from that of said first well region on the surface of said semiconductor layer, an impurity concentration of said second well region gradually decreasing as it goes from the surface of said semiconductor layer toward said semiconductor substrate;

a first buried region of the second conductivity type formed between and adjacent to said first well region and said semiconductor substrate, said first buried region having a higher impurity concentration than the adjacent first well region; a second buried region of the first conductivity type formed between and adjacent to said second well region and said semiconductor substrate and in substantial contact with said first buried region to surround said first buried region, said second buried region having a higher impurity concentration than the adjacent second well region; and semiconductor elements formed in said first well region and said second well region.

In accordance with a third aspect of the present invention, there is provided a method for manufacturing a semiconductor integrated circuit device comprising the steps of;

(a) forming a first buried region of a second conductivity type at a predetermined position on a surface of a semiconductor substrate of a first conductivity type;

(b) forming a second buried region of the first conductivity type in substantial contact with said first buried region on the surface of said semiconductor substrate to surround said first buried region;

(c) forming a semiconductor layer of a predetermined conductivity type on said semiconductor substrate;

(d) forming a first well region of the second conductivity type at a position corresponding to said first buried region on the surface of said semiconductor layer;

(e) forming a second well region of the first conductivity type at a position corresponding to said second buried region on the surface of said semiconductor layer, in contact with said first well region and to surround said first well region; and (f) forming semiconductor elements in said first well region and said second well region.

The present invention will be apparent from the following detailed description taken in conjunction with the accompanying drawings, in which.

Figure 9:
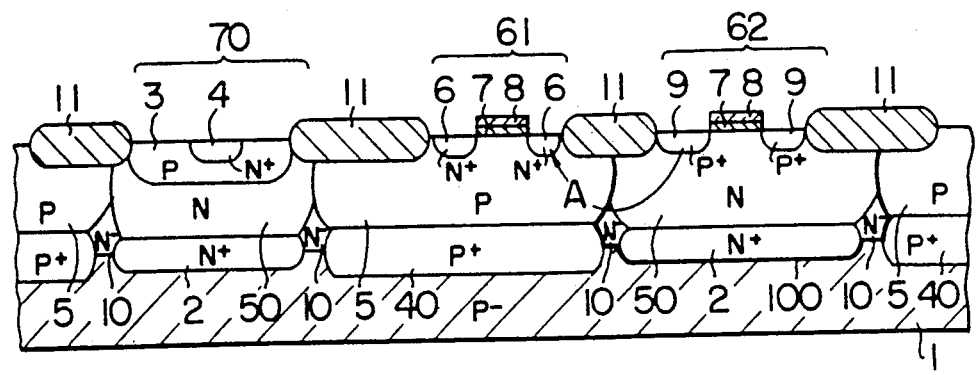
Figure 6:
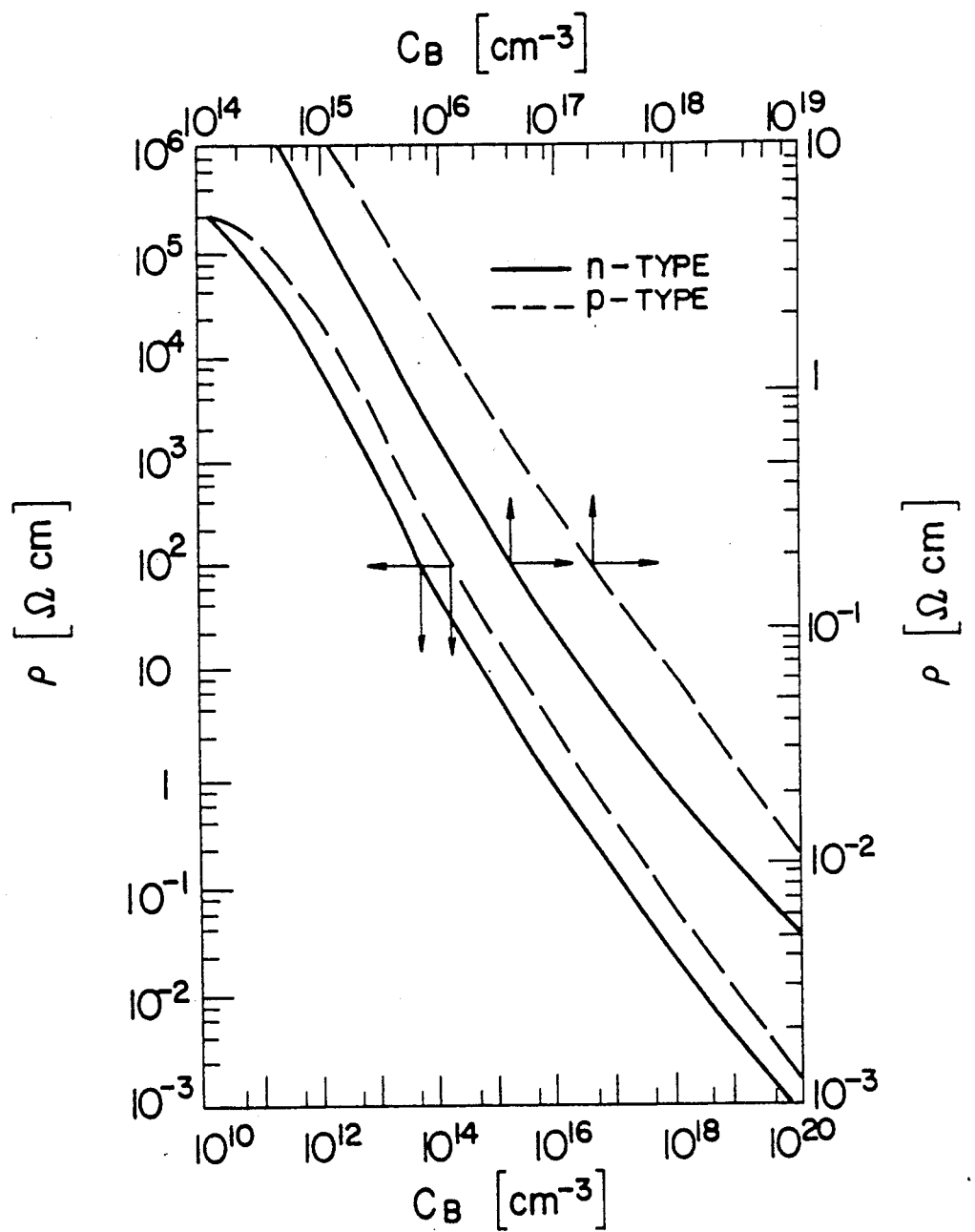
Figure 7:
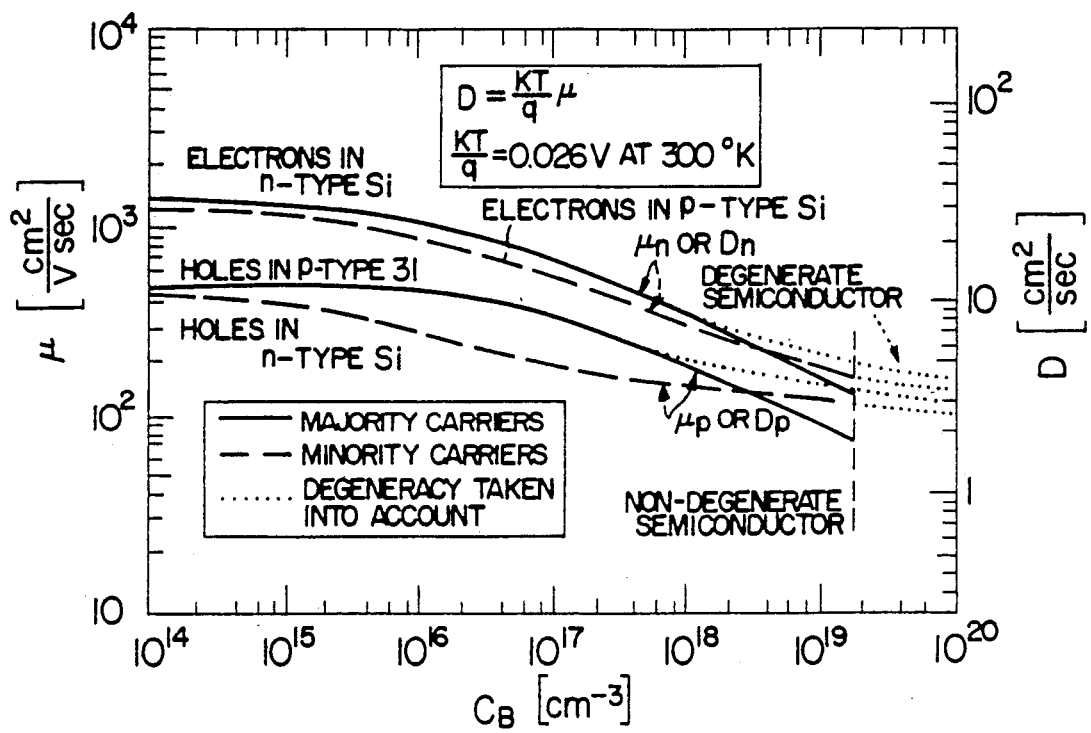
Figure 8:
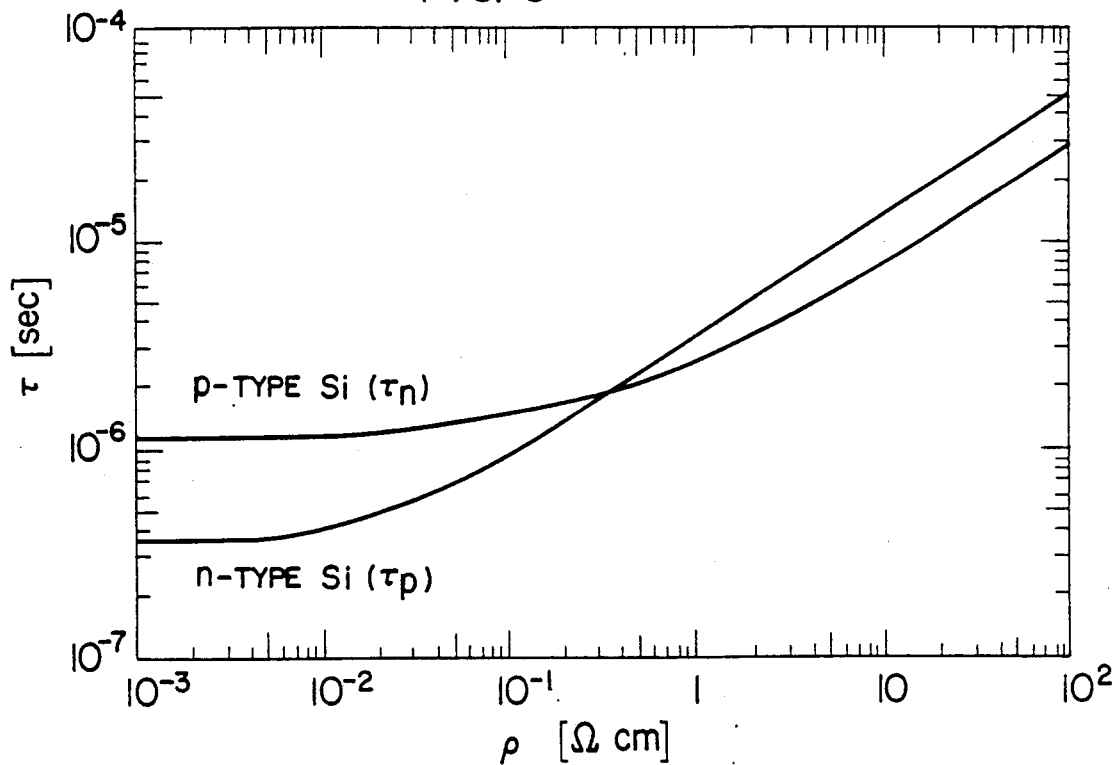
Figure 10A:
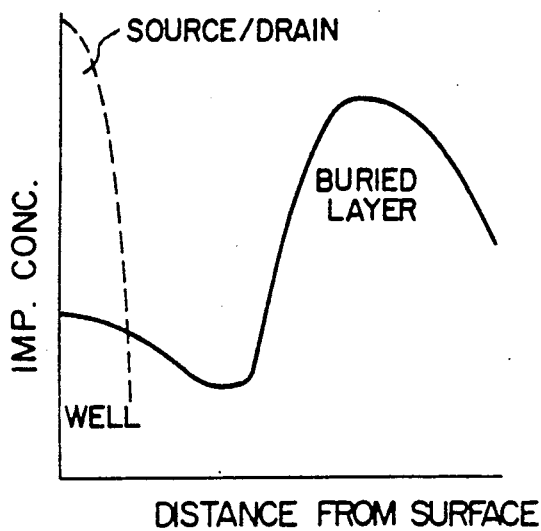
Figure 10B:
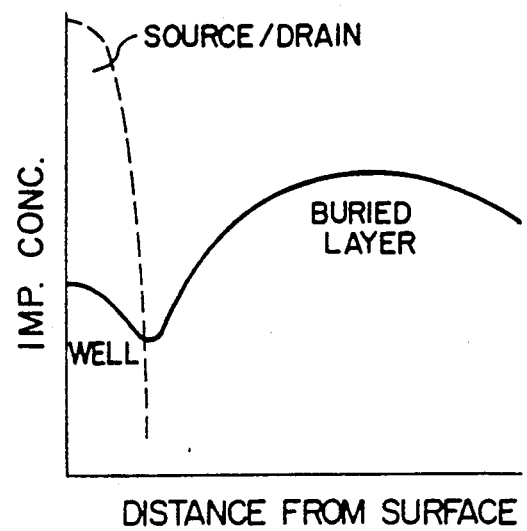
Figure 10C:
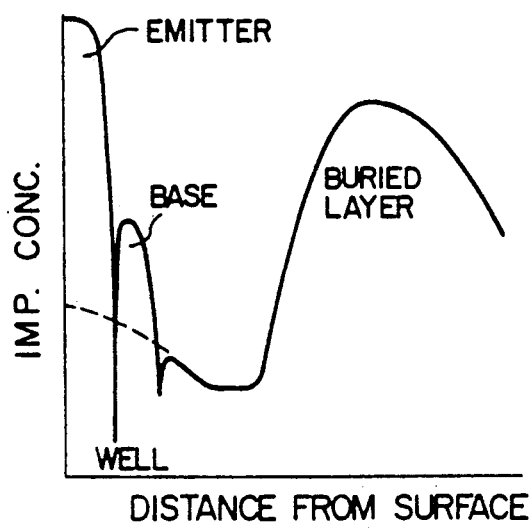
Figure 11:
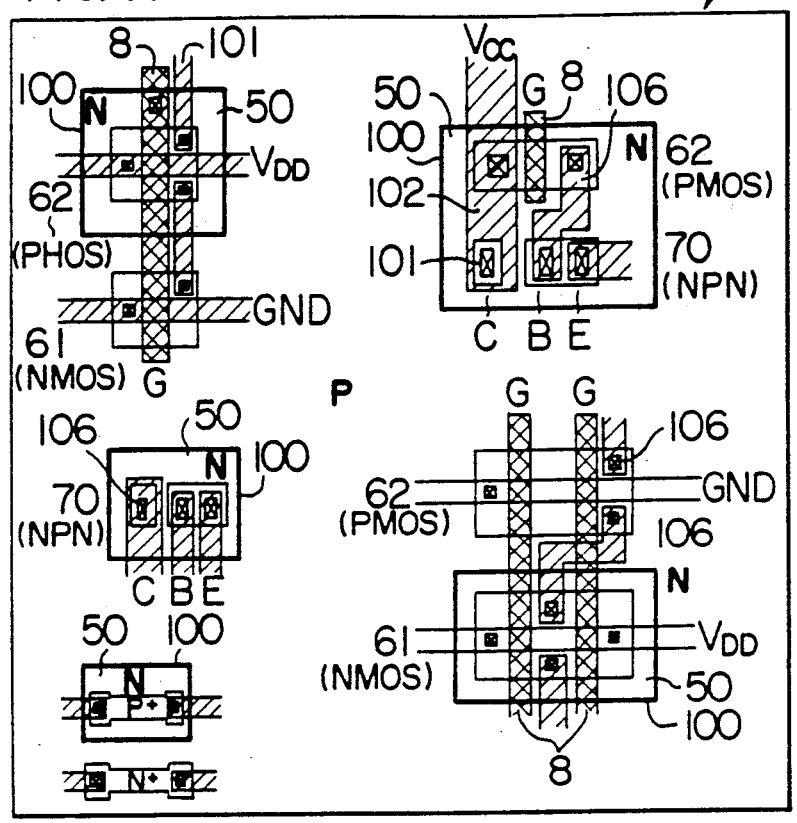
Figure 12A:
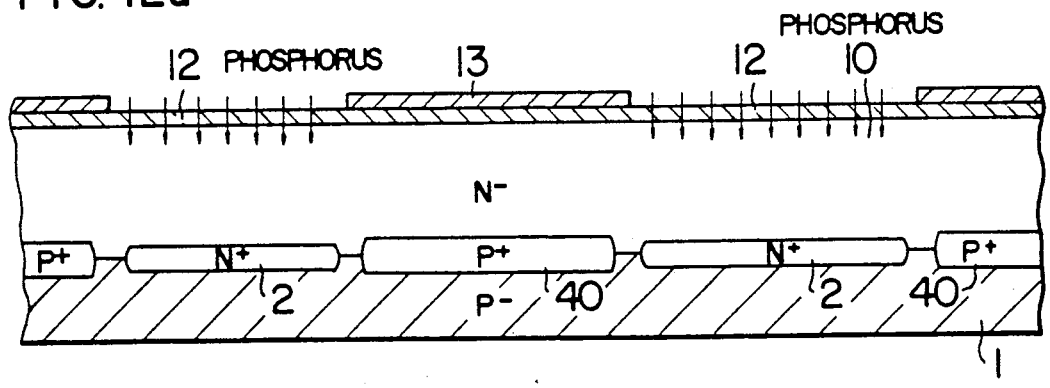
Figure 12B:
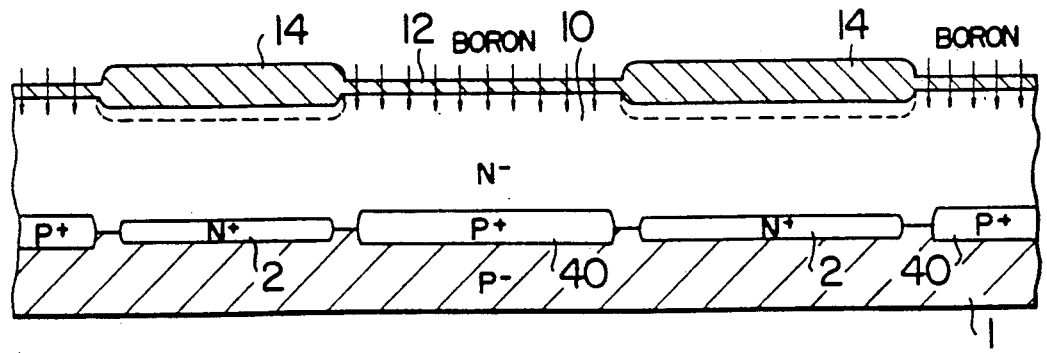
Figure 12C:
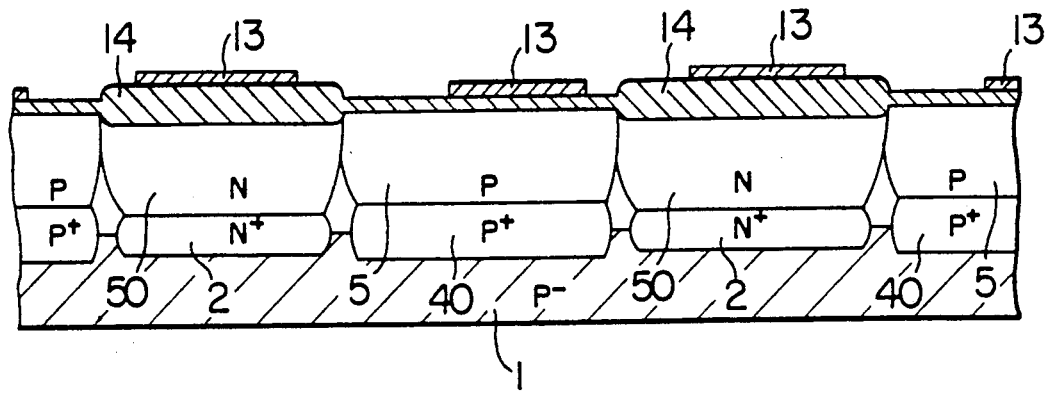
Figure 12D:
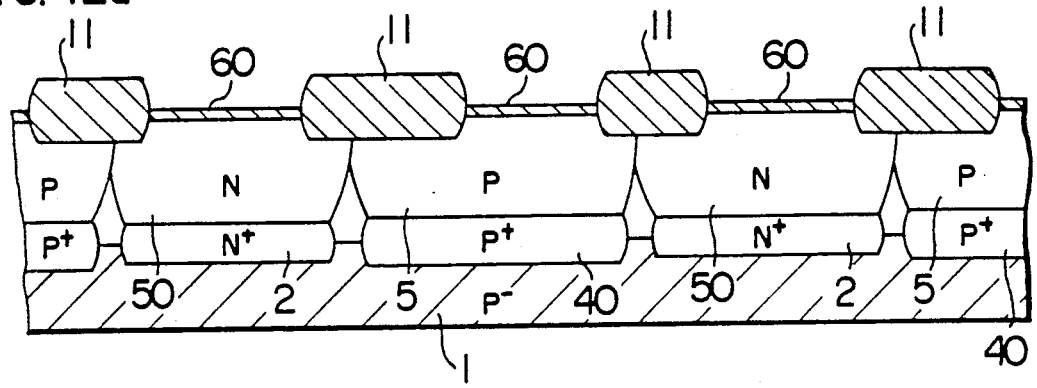
Figure 12E:
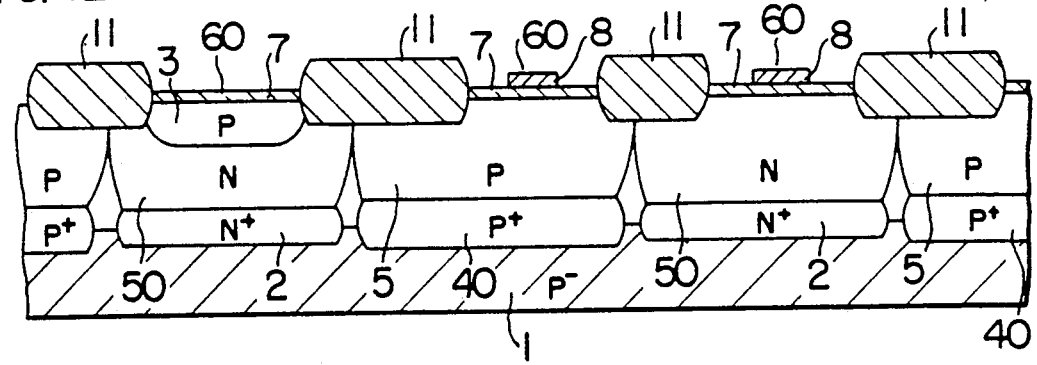
Figure 12F:
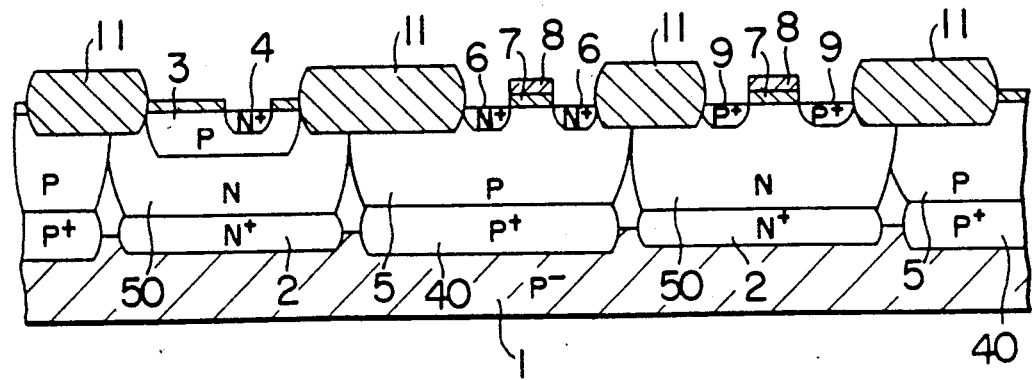
Figure 12G:
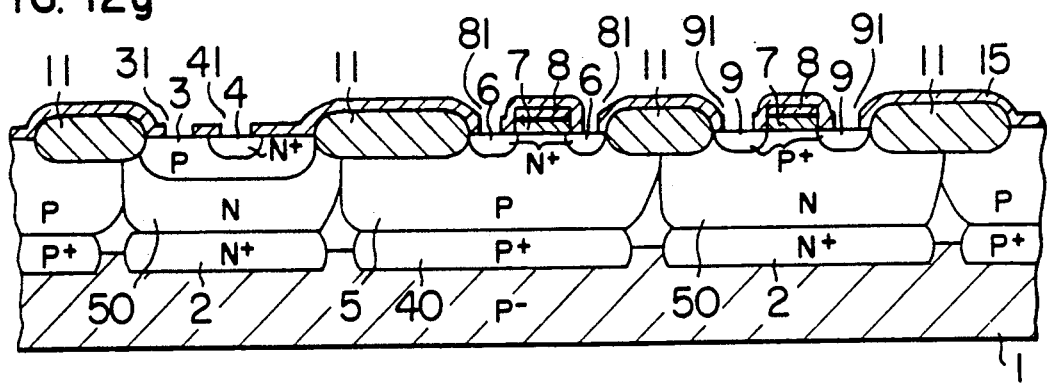
Figure 13:
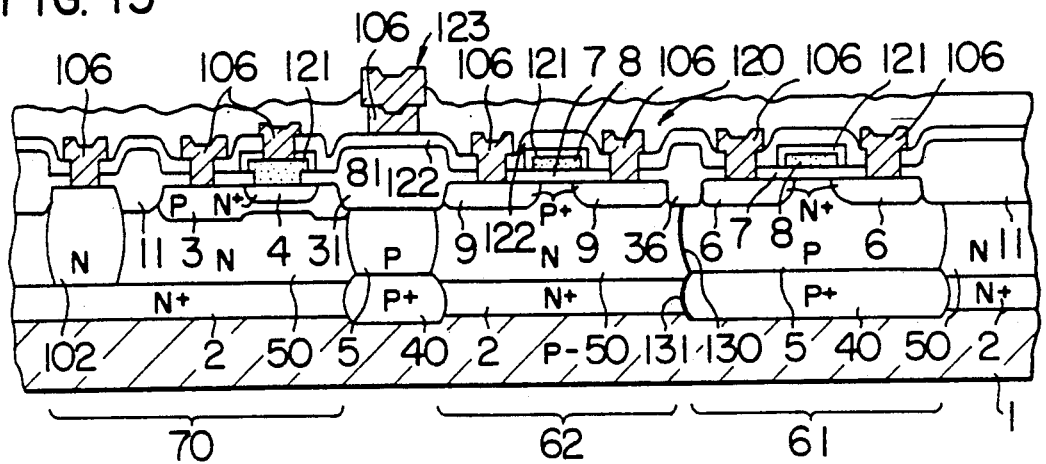
Figure 14:
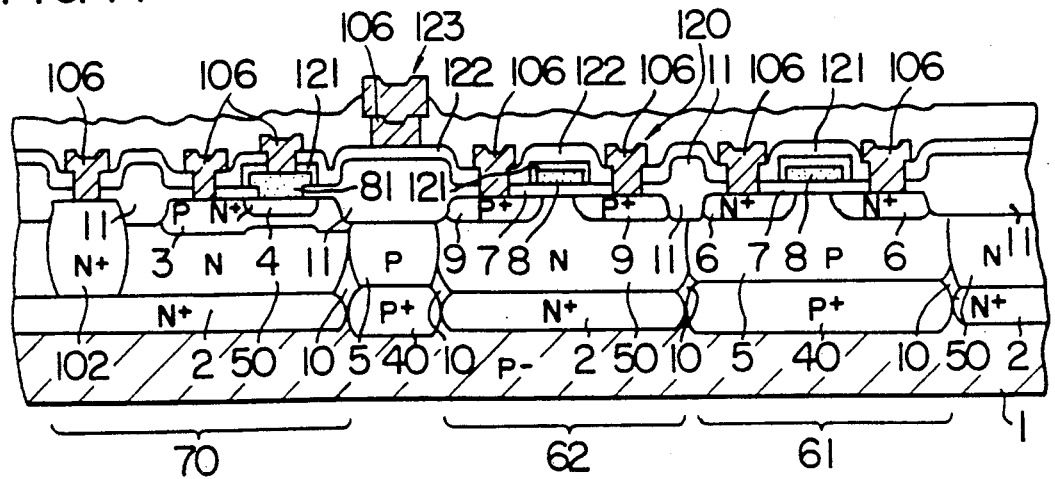
Figure 15A:
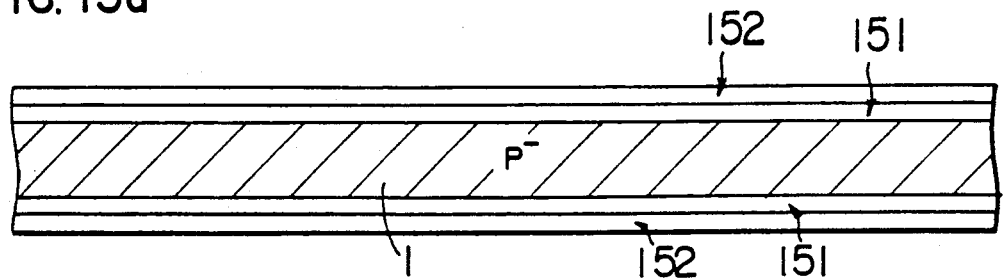
Figure 15B:
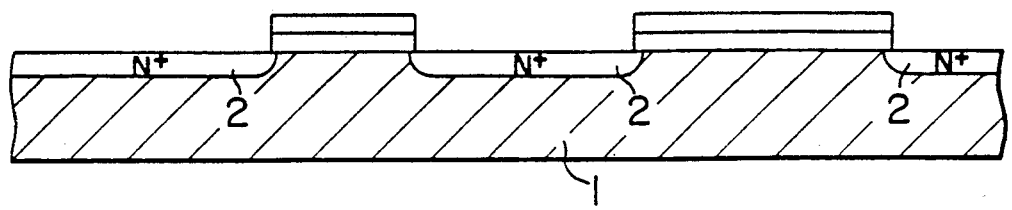
Figure 15C:
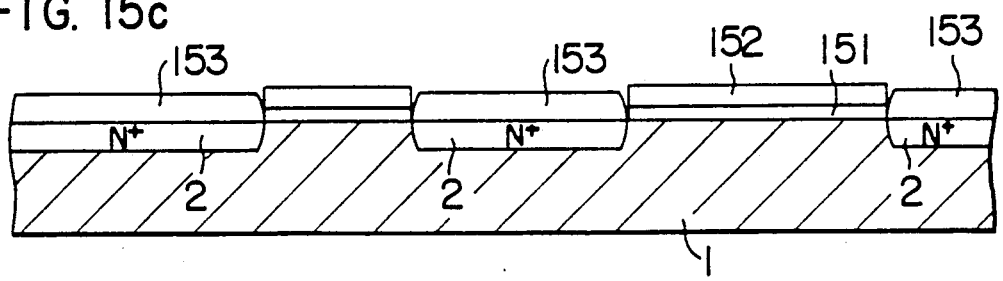
Figure 15D:
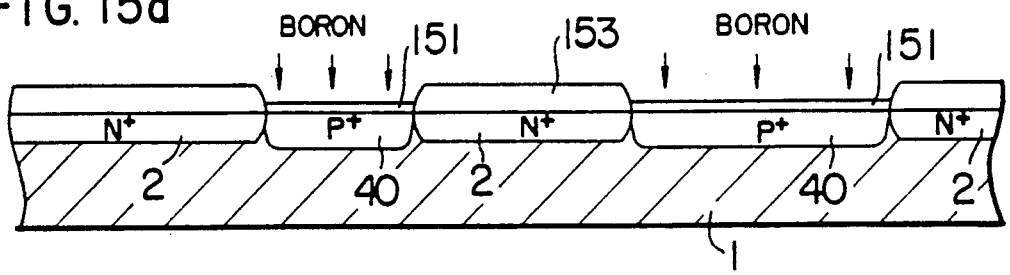
Figure 15E:
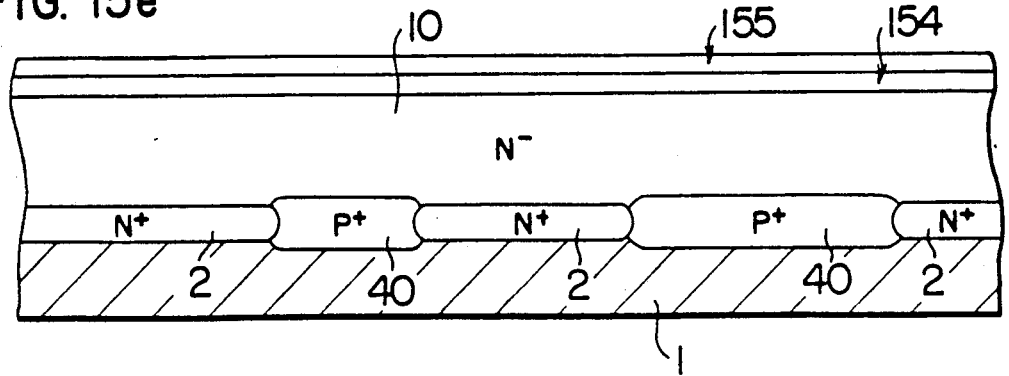
Figure 15F:
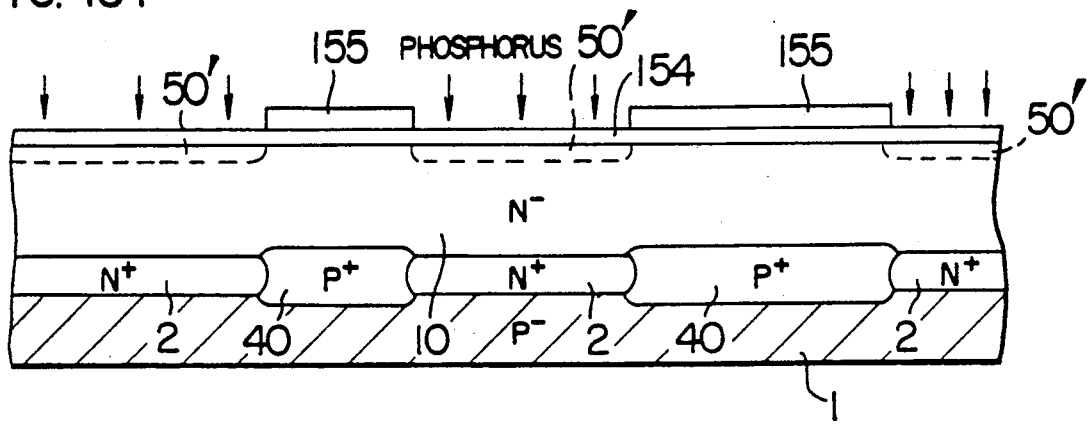
Figure 15G:
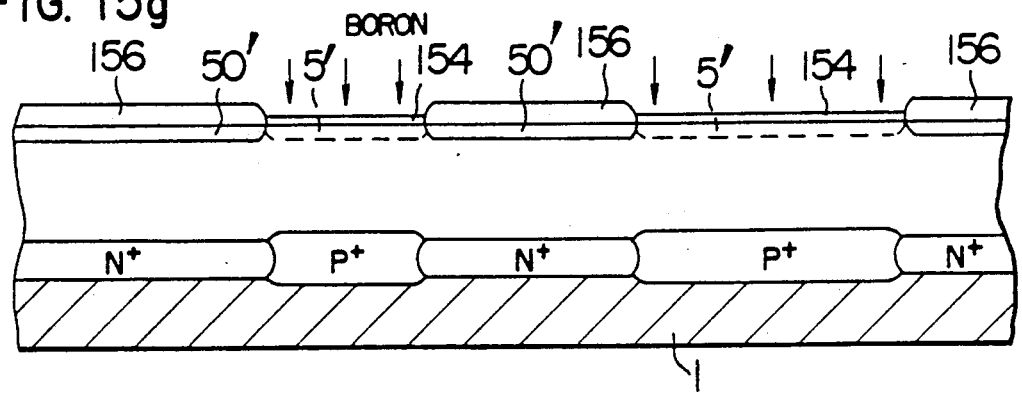
Figure 16:
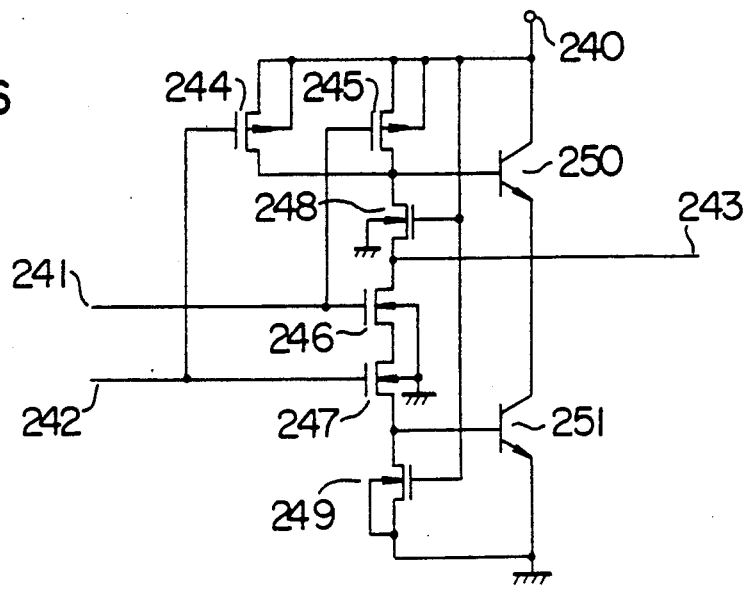
Figure 17:
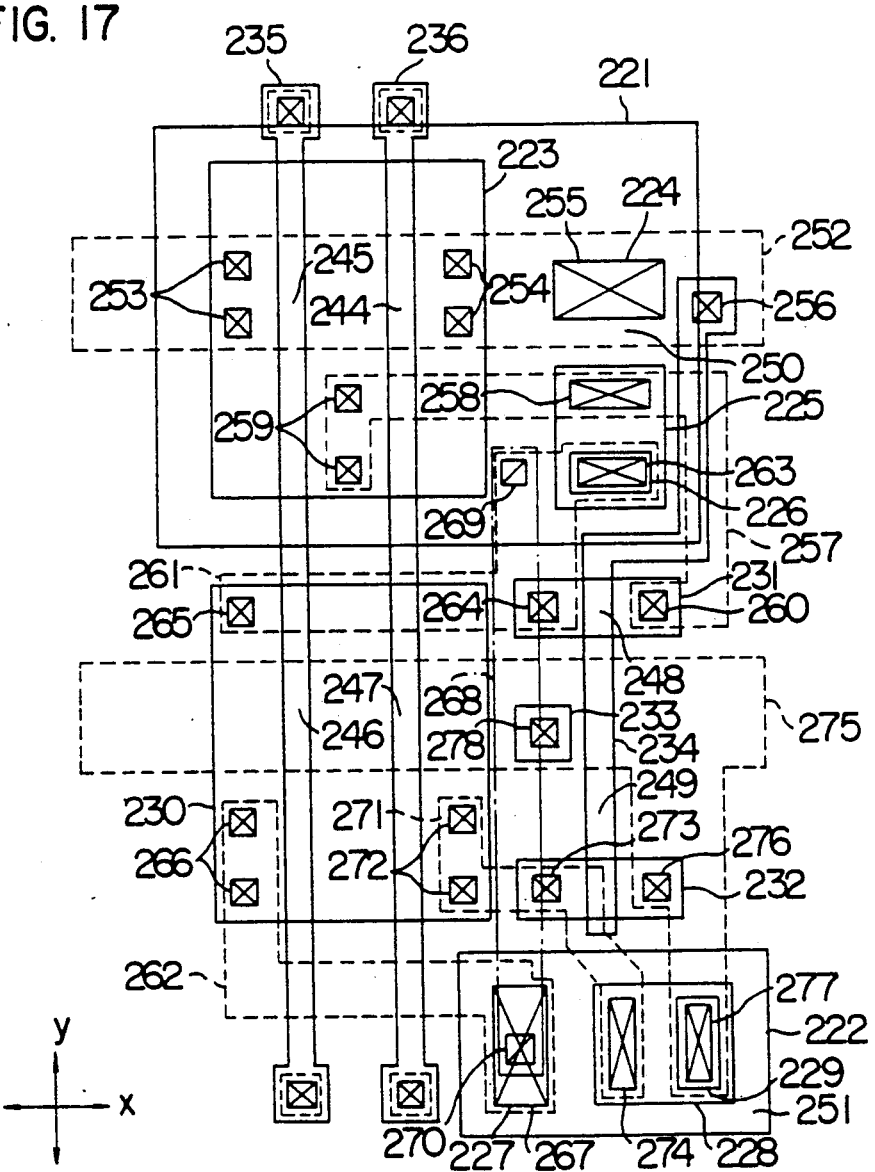
Figure 18:
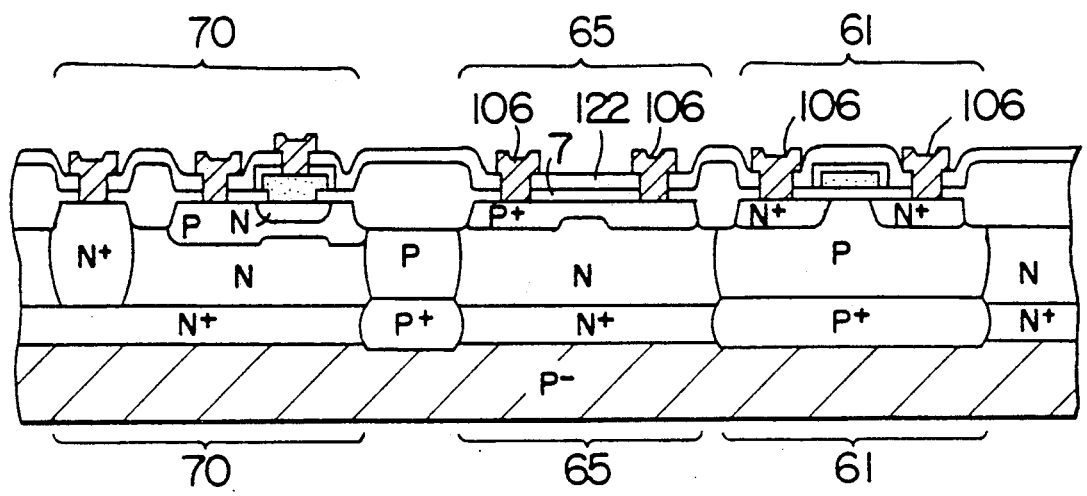
Figure 19:
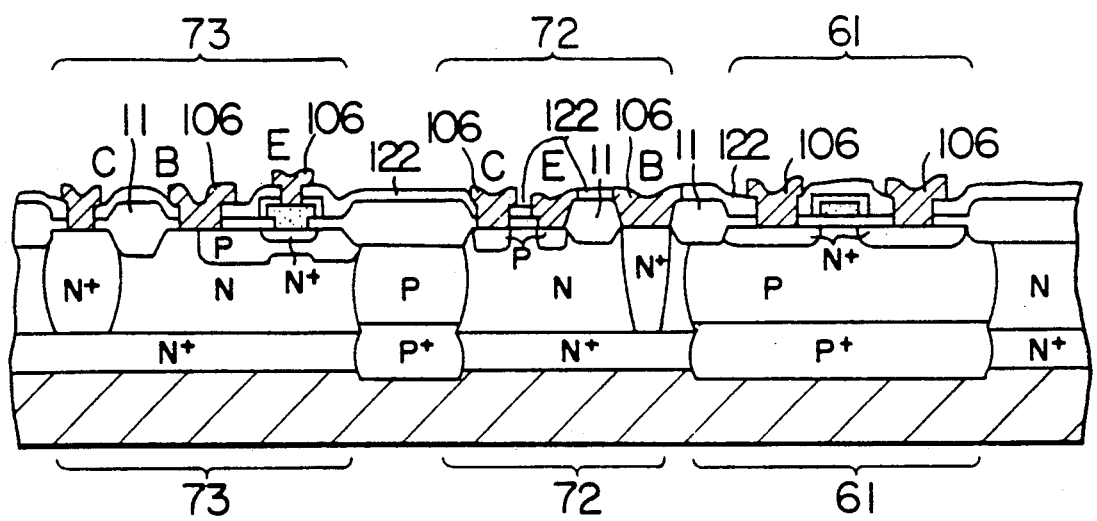

FIG. 6 illustrates a relationship between an purity concentration $C_B$ and a resistivity $\rho$, FIG. 7 illustrates a relationship between the impurity concentration $C_B$ and a diffusion coefficient D, FIG. 8 illustrates a relationship between the resistivity $\rho$ and a carrier lifetime $\tau$, FIG. 9 is a schematic plan view of a BiCMOS LSI in accordance with a first embodiment of the present invention, FIGS. 10a-10c show impurity concentration distributions in the first embodiment, FIG. 11 is a schematic plan view of the first embodiment, FIGS. 12a-12g show manufacturing steps of the first embodiment, FIG. 13 a schematic sectional view of a second embodiment of the present invention, FIG. 14 is a schematic sectional view of a third embodiment of the present invention, FIGS. 15a-15g show manufacturing steps of the second embodiment, FIG. 16 is a diagram of a two-input NAND circuit illustrating wiring for the respective embodiments of the present invention, FIG. 17 is a schematic plan view having the two-input NAND circuit of FIG. 16 wired thereon, FIG. 18 is a schematic sectional view of a fourth embodiment of the present invention, FIG. 19 is a schematic sectional view of a fifth embodiment of the present invention:

FIGS. 20-23 are graphs for explaining operational advantages of the present invention.

The preferred embodiments of the present invention will now be explained in detail. The like or equivalent elements to those shown in FIGS. 1-5 are designated by the like numerals.

FIG. 9 shows a sectional view of a BiCMOS LSI in accordance with a first embodiment of the present invention. The semiconductor substrate 1 is a $P^-$-type silicon, and N well regions 50 and P well regions 5 are formed on the $N^+$ and $P^+$ buried regions 2 and 40, respectively, with impurity concentrations of the well regions gradually decreasing as they go from the surfaces toward the semiconductor substrate 1. A vertical NPN transistor 70 constructed by a P-type base layer 3 and an $N^+$-type emitter layer 4 is formed in one of the N well regions 50, and a PMOS transistor 62 constructed by $P^+$-type source 9, a $P^+$-type drain 9, a gate oxide film 7 and a gate electrode 8 is formed in another N well region 50. An NMOS transistor 61 constructed by an $N^+$-type source 6, and an $N^+$-type drain 6 is formed in the P well region 5. The impurity concentrations of the $N^+$ and $P^+$ buried regions 2 and 40 are higher than those of the adjacent N and P well regions 50 and 5, respectively.

The impurity concentration distributions in the embodiment of FIG. 9 are shown in FIGS. 10a-10c. FIG. 10a shows the concentration distribution in the area of the PMOS 62 shown in FIG. 9, FIG. 10b shows the concentration distribution in the area of the NMOS 61 and FIG. 10c shows the concentration distribution in the area of the NPN transistor 70.

A schematic plan view of the structure of FIG. 9 is shown in FIG. 11.

In FIG. 9, in order to attain the same threshold voltage Vth as that of the prior art structure shown in FIG. 5 with the surface concentration of the PMOS 62 being kept unchanged, it is necessary that the concentration of the $N^-$ epitaxial layer 10 is lower than that of the prior art structure.

In FIG. 9, the NMOS 61 is formed in the P well region 5 and the PMOS 62 is formed in the N well region 50. Since the impurity concentrations of the P well region 5 and the N well region 50 can be controlled by diffusion, the threshold voltages Vth of the NMOS 61 and the PMOS 62 can be independently controlled so that the threshold voltages Vth of the NMOS 61 and the PMOS 62 can be made equal to each other.

Figure 5A:
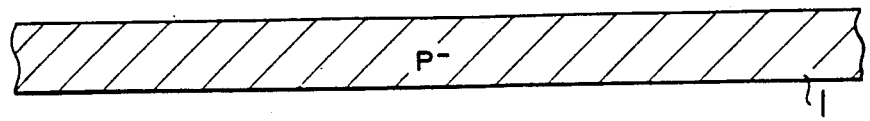
FIGS. 5a-5i show prior art manufacturing steps for a BiCMOS LSI.
Figure 5B:
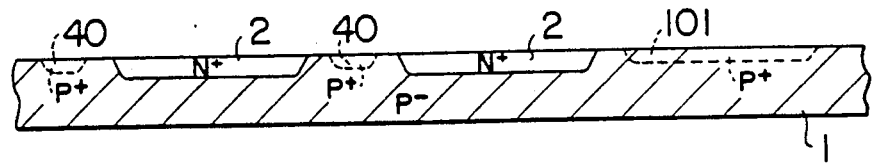
Figure 5C:
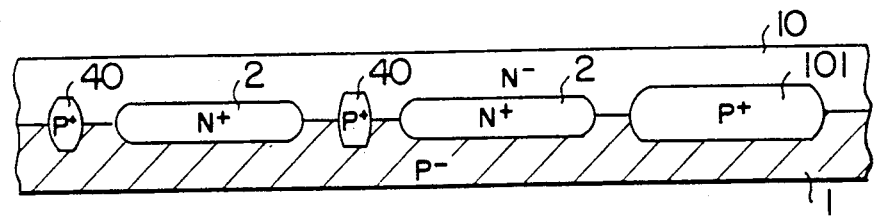
Figure 5D:
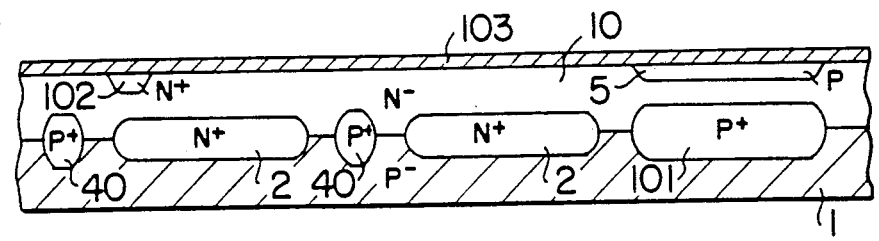
Figure 5E:
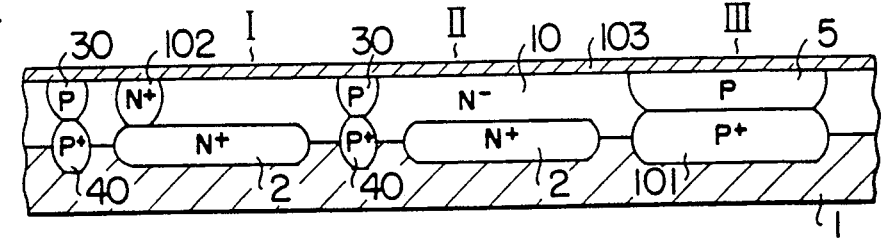
Figure 5F:
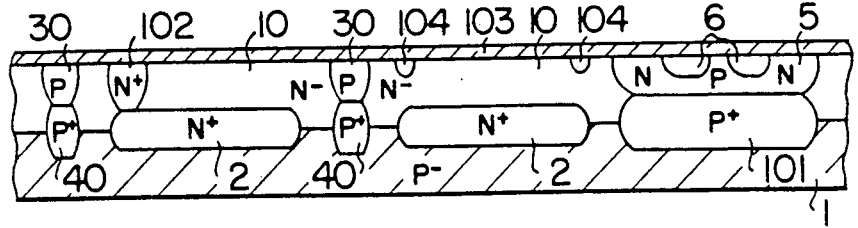
Figure 5G:
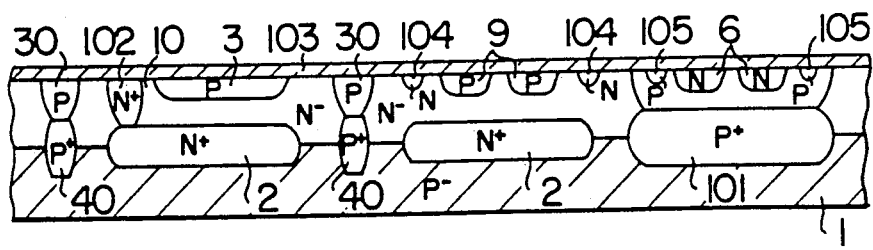
Figure 5H:
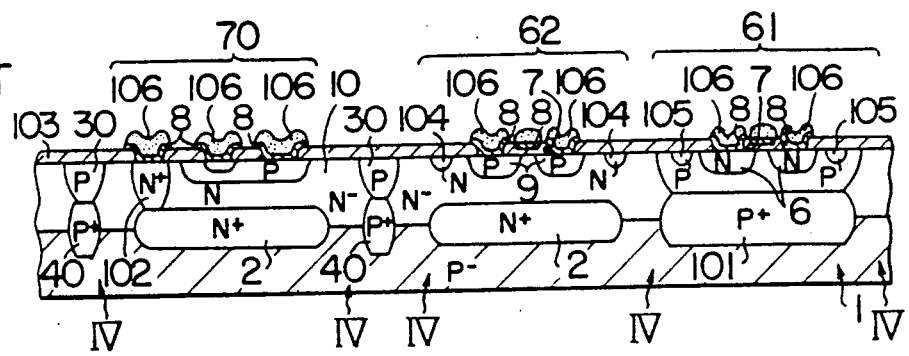
Figure 5I:
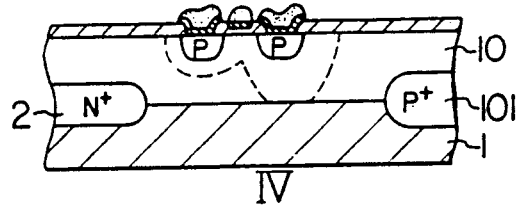

In this embodiment, there are provided $N^{30}$ buried regions 2 in the NPN transistor portion 70 and the P-MOS transistor portion 62, similar to the conventional structure as shown in FIG. 5h, and hence a collector resistance of the NPN transistor 70 is reduced, a punch-through to the $P^-$-type semiconductor substrate 1 by the expansion of a depletion layer around the $P^+$-type drain 9 in the PMOS 62 is prevented.

Accordingly, by providing the $N^+$ buried regions 2 between and adjacent to the N well regions 50 and the $P^{31}$-type semiconductor substrate 1, the vertical NPN transistor 70 and the PMOS 62 are well isolated.

By providing the $P^+$ buried regions 40 between and adjacent to the P well regions 5 and the $P^-$-type semiconductor substrate 1, the P well regions 5 and the $P^-$-type semiconductor substrate 1 are electrically connected, a substrate potential of the NMOS 61 is fixed, and the expansion of the depletion layer around the $N^+$ drain 6 of the NMOS 61 is suppressed by the $P^{30}$ buried region 40.

The N well region 50 and the $N^+$ buried region 2 may be spaced to an extent that the latch-up between the semiconductor elements do not occur. That is, they may be arranged in substantially adjacent to each other. The P well region 5 and the $P^+$ buried region 40 are in electrical contact to each other.

In this manner, by forming the $N^+$ buried regions 2 and the $P^+$ buried regions 40 under the N well region 50 and the P well region 5, respectively, the semiconductor elements such as the vertical NPN transistor 70 and the PMOS transistor 62 are formed in the N well regions 50 and the semiconductor elements such as the NMOS transistor 61 are formed in the P well regions 5 of the different conductivity type on the same substrate.

Another feature of the above structure is that the N well regions 50 are surrounded by the adjacent P well regions 5. Since the P well regions 5 serve as the isolation layers to the N well regions 50, no separate isolation layer is necessary and the integration density is improved.

FIG. 12 shows manufacturing steps of the BiCMOS LSI of the present embodiment.

(FIG. 12a)

The N+ buried regions 2 and the P+ buried regions 40 are formed on the surface of the P⁻-type silicon substrate 1, and then the N-type epitaxial layer 10 having a substantially uniform impurity concentration distribution is grown thereon to a thickness of 3–4 μm. The surface of the epitaxial layer 10 is oxidized to form a thin oxide layer 12 of approximately 50 nm thickness, and a nitride film ($Si_3N_4$) 13 is coated thereon. The portions of the nitride film 13 which face the N+ buried regions 2 are removed by a selective photo-etching process while leaving the nitride film on the P³⁰ buried regions 40. The selective etching may be done by a known photo-resist method. Then, phosphorus is doped by a known ion implantation method with ion dose per unit area of $10^{11}$–$10^{13}$/cm² to the areas not coated by the nitride film 13. The phosphorus is implanted into the N-type epitaxial layer 10 through the thin oxide film 12 but it is not doped in the areas coated by the nitride film 13 by a mask function of the nitride film 13.

(FIG. 12b)

After the ion implantation of phosphorus, the substrate is heat-treated in an oxidizing atmosphere. As a result, the oxide film on a portion doped with phosphorus is further grown but the portion coated with the nitride film is not oxidized and maintain the initial thin oxide film thickness. This method is called LOCOS (Local Oxidization of Silicon) and has been known as a method for locally forming the oxide film. In the present embodiment, the film thickness of the thickened portions 14 is 150 nm.

Then, the nitride film 13 is removed and boron is ion-implanted at a dose of $10^{11}$–$10^{13}$/cm². Since the oxide film portions 14 having phosphorus implanted therein were thickened in the LOCOS local oxization step, the boron cannot pass through the oxide film portions 14. On the other hand, since the oxide film thickness of the portions 12 having phosphorus not doped is thin, boron is implanted into the N-type epitaxial layer 10 through the thin oxide film portions 12.

(FIG. 12c)

The phosphorus and boron doped in the above step are diffused at 1000° C.–1200° C. until they reach the N+ and P+ buried layers 2 and 40, respectively, to form the N well regions 50 and the P well region 5.

By the well formation method described above, the boron is doped in the areas other than the areas in which the phosphorus is doped. Thus, the characteristic structure of the present invention in which all areas other than the N well regions 50 are P well regions 5 is attained. This manufacturing method is called a self alignment method because once the N well regions 50 are positioned the P well regions 5 need not be positioned.

(FIG. 12d)

An isolation oxide film 11 having a thickness of 1 μm is formed by the LOCOS method using the nitride film 13 as a mask in the areas on the surfaces of the N well regions 50 and the P well regions 5 other than active regions 60 in which the semiconductor elements such as the bipolar transistors and the MOS transistors are to be formed later.

(FIG. 12e)

The thin oxide film portions 14 (having the film thickness of ca. 150 nm) on the surfaces of the N well regions 50 are removed, and the P-type base layer 3 of the NPN transistor having a sheet resistivity of 300 Ω/□ is formed by the thermal diffusion method or the ion implantation method to a depth of 0.6 μm, the oxide films in the active regions 60 are then removed and gate oxidation films 7 having a thickness of 50 nm are formed. Then, poly-silicon layers 8 to be used as the gates of the MOS transistors are formed to a thickness of 0.3 μm by a CVD (Chemical Vapor Deposition) method, and the poly-silicon layers 8 are etched into a predetermined shape by a photo-resist method.

(FIG. 12f)

The N+-type emitter layer 4 of the vertical NPN transistor is formed in the P-type base layer 3, the source and drain 6 of the NMOS are formed in the active region in the P well regions 5, and the source and drain 9 of the PMOS are formed in the active region of the N well region 50. In the present embodiment, the N+-type emitter 14 and the source and drain 6 of the NMOS are doped with arsenic by the ion implantation method and diffused by heat treatment to depths of 0.4 μm and 0.3 μm, respectively. The source and drain 9 of the PMOS are doped with boron by the ion implantation method and diffused to a thickness of 0.4 μm by heat treatment.

(FIG. 12g)

Then, a phosphorus glass 15 having a thickness of 0.5 μm serving as a passivation glass is formed by CVD method and contact windows for the active elements are The contact regions are emitter 41, base 31, NMOS source and drain 81 and PMOS source and drain 91.

FIG. 13 shows a schematic sectional view of a second embodiment of the present invention. The like numerals to those shown in FIGS. 5 and 9 designate the like or equivalent elements. Numeral 120 denotes an insulating film for a first wiring 106 such as aluminum and a second wiring 123. Specifically, it is a laminated layer of $SiO_2$, SOG (spin on glass) and PSG (phosphosilicate glass). Numeral 121 denotes an $SiO_2$ film and numeral 122 denotes a laminated layer of a PSG film and a SOG film.

A difference from the first embodiment shown in FIG. 12 resides in the structures of the buried regions 2 and 40. All areas other than the N+ buried regions 2 are occupied by the P+ buried regions 40, and the N+ buried layers 2 are in substantial contact with the P+ buried regions and are surrounded by the P³⁰ buried regions. In order to isolate the N-type regions including the N well regions 50 and the N+ buried regions 2 from the P⁻-type semiconductor substrate 1, the N+ buried regions 2 are scattered in the P+ buried region 40.

$$L = \sqrt{D\tau} \qquad (1)$$

D is a carrier diffusion coefficient and $\tau$ is a carrier lifetime.

Figure 1:
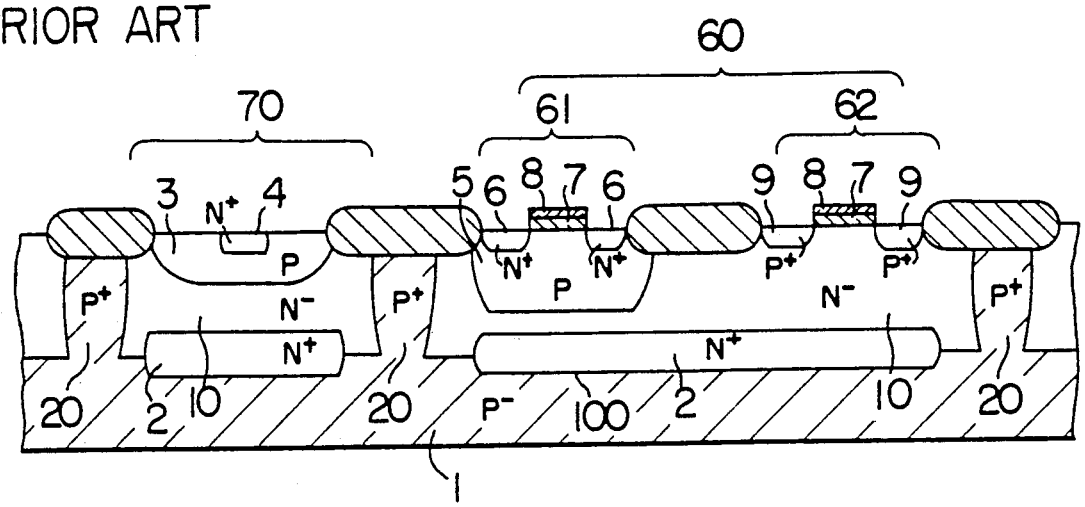
FIG. 1 is a sectional view of a prior art BiCMOS LSI.
Figure 2:
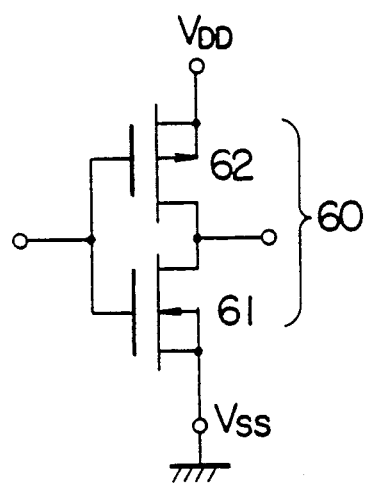
FIG. 2 is a schematic plan view of the prior art BiCMOS LSI.
Figure 3:
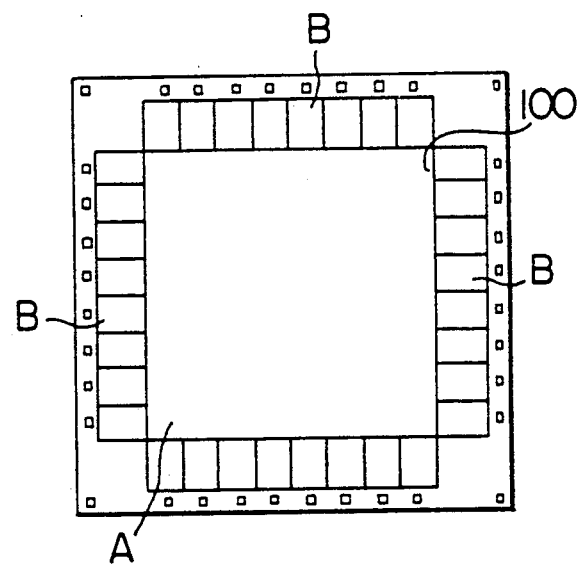
FIG. 3 shows a prior art CMOS inverter circuit.
Figure 4:
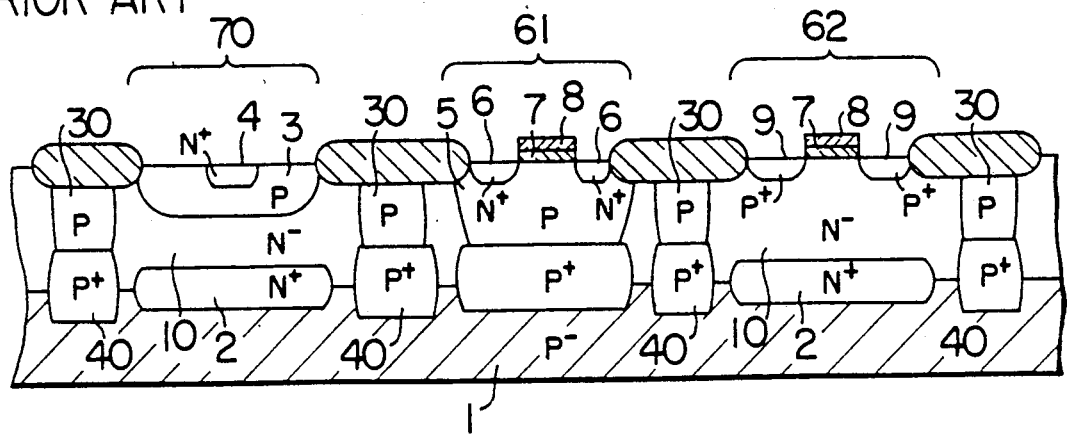
FIG. 4 is a sectional view of another prior art BiCMOS LSI.

As shown in FIGS. 6–8, it has been known that both D and $\tau$ increase as the resistivity increases and the concentration decreases ("SILICON SEMICONDUCTOR DATA" FIG. 2.2.1, 2.3.1 and 7.3.2, Helmut F. Wolf, 1969, Permagon Press).

In the first embodiment shown in FIG. 9, the N⁻ epitaxial layer 10 having the relatively low concentration (or the relatively high resistivity) is left at the boundary to the N well region 50, the P well region 5, the N+ region 2 and the P+ buried region 40. As a result, the diffusion length L of the N⁻ epitaxial layer 10 is large and the latch-up is apt to occur between semiconductor elements such as the PMOS 62 and the NMOS 61 as shown by an arrow A in FIG. 9. Further, no semiconductor element can be formed in the semiconductor layer on the N³¹ epitaxial layer 10 because of the possible punch-through to the substrate 1. Accordingly, the integration density can not be remarkably improved.

In the structure of the present embodiment, since the high concentration and low resistivity N+ buried region 2 and P+ buried region 40 contact to each other, the relatively low concentration (high resistivity) N− epitaxial layer 10 is eliminated and the latch-up between the semiconductor elements is more hardly to occur and the punch-through to the substrate 1 is also more hardly to occur. In other words, the space between the semiconductor elements can be reduced more than in the first embodiment, and the integration density can be more improved.

The structure of the present embodiment can be manufactured in a simple process to be described later.

Further, since the boundary plane 130 of the N well region 50 and the P well region 5, and the boundary plane 131 of the N+ buried region 2 and the P+ buried region 40 are substantially continuous and in a substantial one plane, the contact plane of the N well region 50 and the P+ buried region 40, and the contact plane of the P well region 5 and the N+ buried region 2 are reduced and the punch-through between the semiconductor elements and the substrate 1 is further prevented.

The N+ buried regions 2 and the P+ buried regions 40 may be spaced from each other to an extent to prevent the latch-up between the semiconductor elements and the punch-through between the semiconductor elements and the substrate 1. They may be substantially contacted to each other. When they perfectly contact as is the case of the present embodiment, the effect of prevention is further enhanced.

The N− epitaxial layer 10 may be left to an extent that the latch-up or the punch-through does not occur, as will be explained later in connection with a third embodiment shown in FIG. 14.

In FIGS. 13 and 14, although the P well region contacts the N well region 50 and surrounds the N well region 50, it can also be configured in other ways. For example, the P well region 5 in FIGS. 13 and 14 may not contact the N well region 50, but can be separated by a certain distance. It is only required that the P well region 5 and the N well region 50 are formed at different locations.

FIGS. 15a–15g show manufacturing steps for the second embodiment shown in FIG. 13.

(FIG. 15a)

The main surface of the P-type silicon semiconductor substrate 1 having a resistivity of 9–12 Ω-cm is oxidized to form a SiO$_2$ film 151, and a Si$_3$N$_4$ film 152 is formed thereon.

(FIG. 15b)

The Si$_3$N$_4$ film 152 and the SiO$_2$ film 151 are selectively etched by using a first mask (not shown), and N+ impurity such as antimony is doped in predetermined areas on the surface of the semiconductor substrate 1 to form the N+ buried regions 2.

(FIG. 15c)

A SiO$_2$ film 153 having a thickness of approximately 4000 Å is formed on the surfaces of the N+ buried regions 2 by the LOCOS method using the Si$_3$N$_4$ film 152 as a mask.

(FIG. 15d)

After the Si$_3$N$_4$ film 152 has been removed, boron B+ is ion-implanted and the substrate is annealed to form the P+ buried regions 40 by the self-alignment method. The N+ buried regions 2 are surrounded by the P+ buried regions 40.

(FIG. 15e)

The SiO$_2$ films 151 and 153 are removed, and the N− epitaxial layer 10 having a resistivity of approximately 3 Ω-cm is formed on the surface of the semiconductor substrate 1 to a thickness of approximately 3–4 μm. A maximum impurity concentration of the N+ buried regions 2 is $10^{18}$ cm$^{-3}$ or higher, and a maximum impurity concentration of the P+ buried regions 40 is $10^{17}$ cm$^{-3}$ or higher.

The surface of the epitaxial layer 10 is oxidized to form a SiO$_2$ film 154 to a thickness of approximately 400 Å, and a Si$_3$N$_4$ film 155 is formed thereon.

The subsequent steps are essentially identical to those of FIG. 12, and they are explained in further detail.

(FIG. 15f)

The Si$_3$N$_4$ film 155 is selectively etched by using the first mask used in the step of FIG. 15b, and phosphorus P+ is ion-implanted to the surface of the N− epitaxial layer 10 to form N regions 50′.

Since the first mask is again used in this step, the N regions 50′ are formed in registration to the N+ buried regions 2.

(FIG. 15g)

SiO$_2$ films 156 are formed on the surfaces of the N regions 50′ by the LOCOS method by using the Si$_3$N$_4$ film 155 as a mask. Then, the Si$_3$N$_4$ film 155 is removed and boron B+ is ion-implanted to form P regions 5′ by the self-alignment method.

Figure 15H:
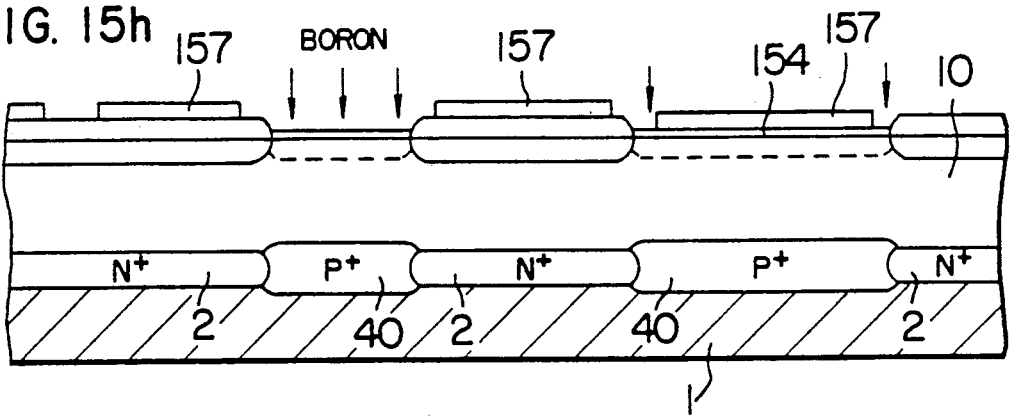

(FIG. 15h)

Si$_3$N$_4$ films 157 are selectively formed in the active regions and boron B+ is ion-implanted.

Thus, the impurity concentration of the P well regions between the active regions in which the semiconductor elements such as the NPN transistors 70, the NMOS 61 and the PMOS 62 are to be formed is higher than that of the active regions and the latch-up between the semiconductor elements is further suppressed.

Figure 15I:
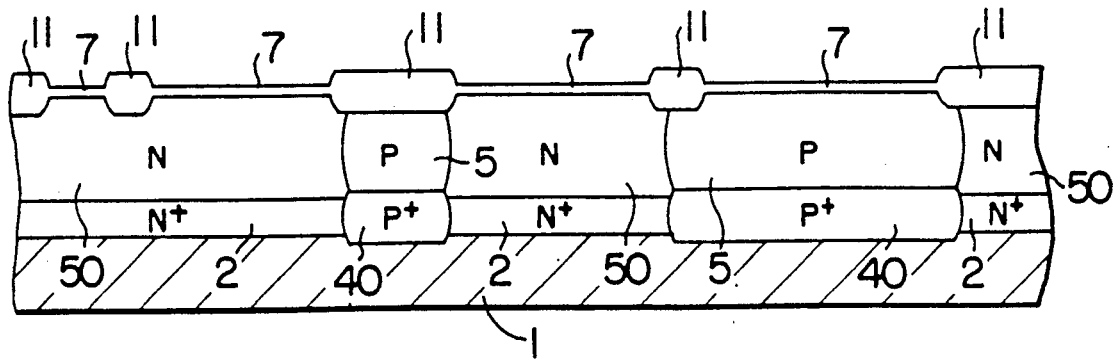

(FIG. 15i)

The phosphorus and boron doped in the previous steps are diffused at 1000° C.–1200° C. until they reach the N+ and P+ buried regions 2 and 40, respectively, to form the N well regions 50 and the P well regions 5.

The thick isolation oxide film 11 having a thickness of approximately 1 μm is formed in the areas other than the active regions by the LOCOS method using the Si$_3$N$_4$ film 157 as a mask.

Then, the SiO$_2$ films 154 in the active regions are removed, and the SiO$_2$ films 7 serving as the gate oxidation films are formed to a thickness of approximately 50 nm.

Figure 15J:
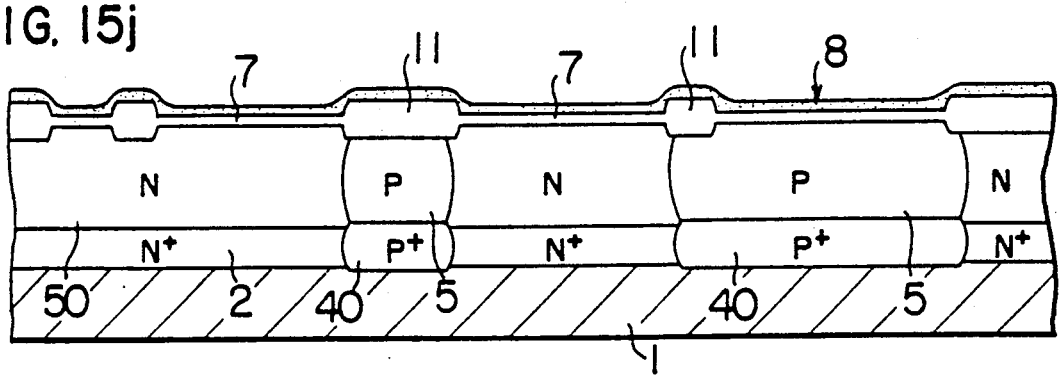

(FIG. 15j)

The poly-silicon layer to be used as the gates of the NMOS 61 and the PMOS 62 is formed to a thickness of approximately 3500 Å by the CVD method.

Figure 15K:
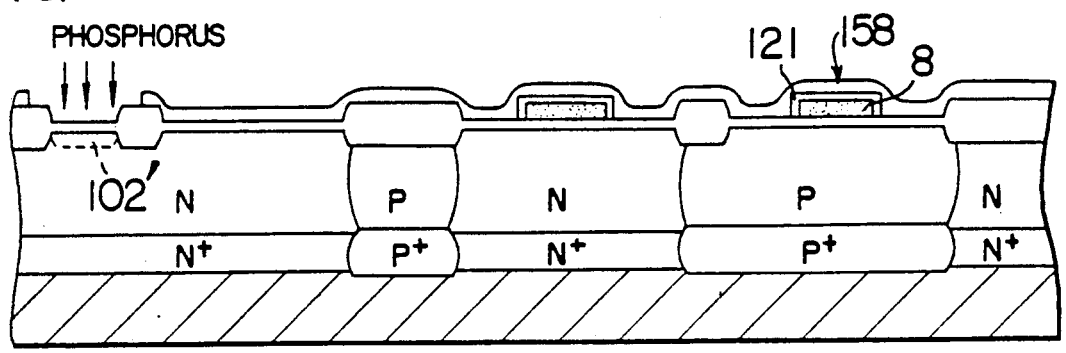

(FIG. 15k)

The poly-silicon layer 8 in the areas other than the gates of the NMOS 61 and the PMOS 62 is selectively removed, and SiO$_2$ films 121 are formed on the surfaces of the poly-silicon layers 8 in the gate areas.

Then, a resist 158 is selectively applied and phosphorus P+ is selectively ion-implanted to an area 102′ in which a collector electrode of the NPN transistor 70 is to be formed.

Figure 15L:
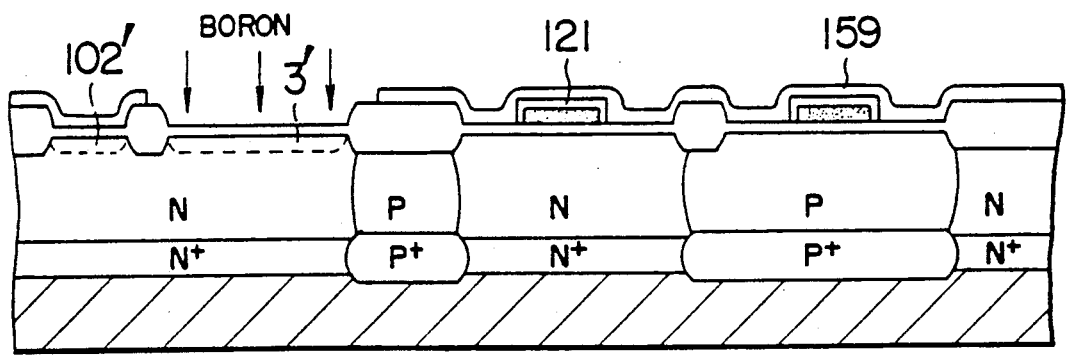
Figure 15M:
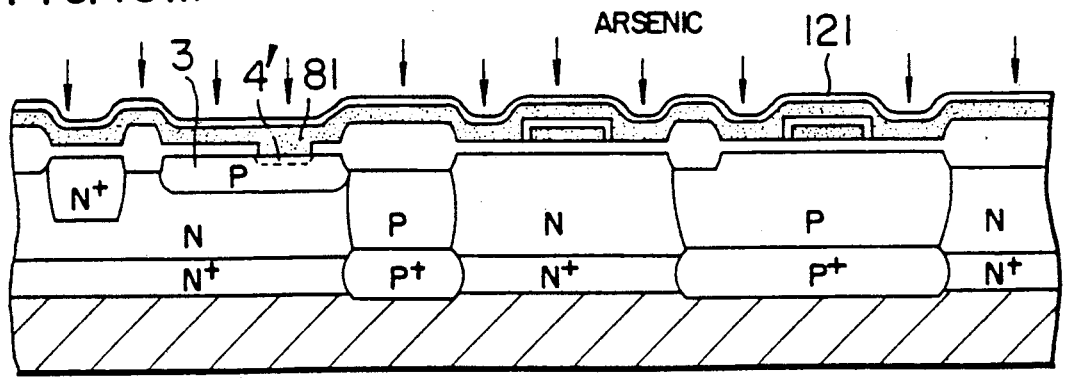

(FIG. 15l)

The resist 158 is removed, and another resist 159 is selectively applied, and boron B+ is selectively ionplanted to an area 3' in which a base of the NPN transistor 70 is to be formed.

FIG. 15m)

a second poly-silicon layer 81 having a thickness of approximately 1500 Å is formed by the CVD method, the base region 3' is annealed, the surface of the second poly-silicon layer 81 is oxidized to form the SiO$_2$ film 12, and arsenic As is ion-implanted to an area in which an emitter region 4' of the NPN transistor 70 is to be formed.

Figure 15N:
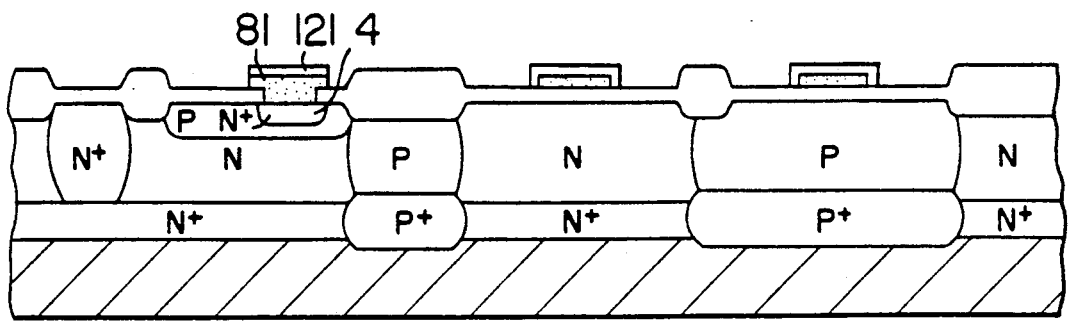

(FIG. 15n)

Then, the substrate is again annealed to form the emitter region 4, and the SiO$_2$ film 121 and the second poly-silicon layer 81 are selectively removed to form the emitter electrode.

Figure 15O:
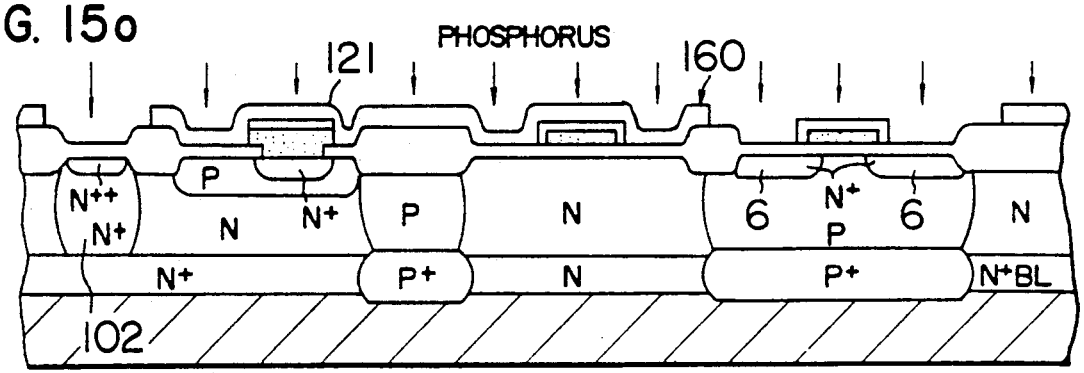

(FIG. 15o)

A resist 160 is selectively applied and phosphorus P+ is doped in the source and drain regions 6 of the NMOS 61 and the region 102 in which the collector electrode of the NPN transistor 70 is to be formed.

Figure 15P:
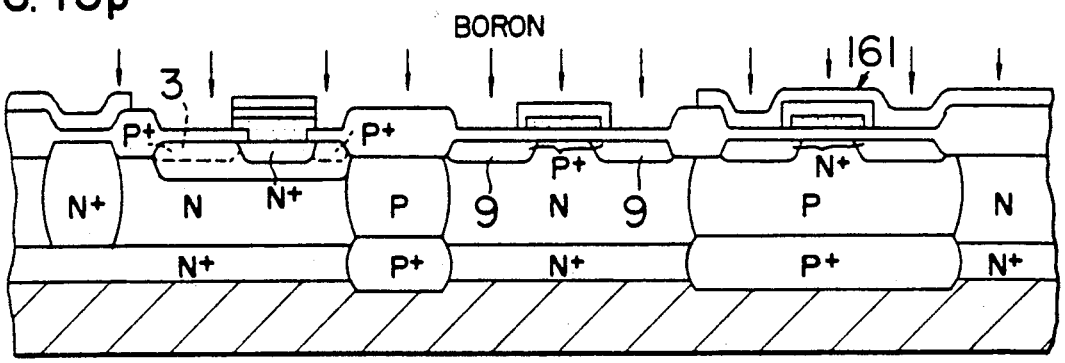

(FIG. 15p)

The resist 160 is removed and another resist 161 is selectively applied, and boron B+ is doped in the source and drain regions 9 of the PMOS 62 and the surface of the base 3 of the NPN transistor 70. Thus, the base resistance of the NPN transistor 70 is reduced.

Figure 15Q:
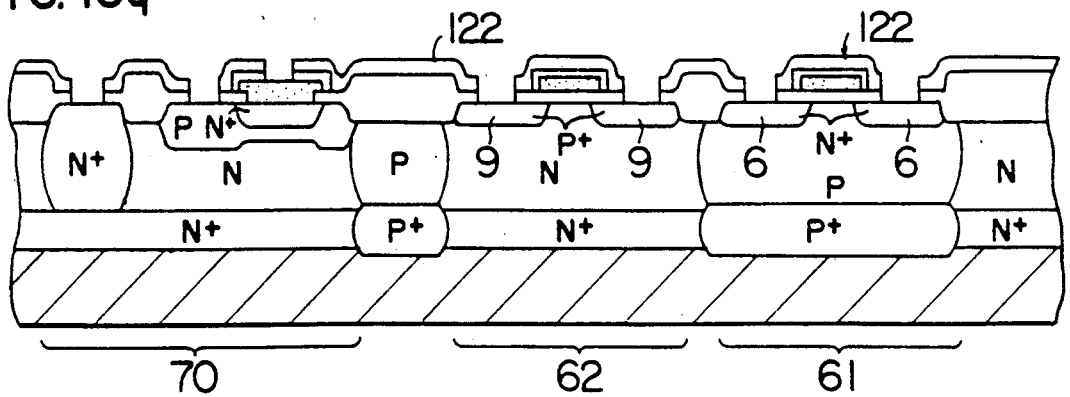

(FIG. 15q)

The resist 161 is removed, a PSG-SOG film 122 is formed, and the PSG-SOG-SiO$_2$ films 121 in the areas in which the electrodes for the source and drain 6 of the NMOS 61, the source and drain 9 of the PMOS 62 and the emitter, base and collector of the NPN transistor 70 are to be formed are removed.

Then, a first aluminum wiring 106, an insulation layer 120 and a second wiring 123 are formed. Thus, the second embodiment of FIG. 13 is completed.

As an example of wiring in the first, second and third embodiments of the present invention, a schematic plan view of a wiring of a two-input NAND circuit shown in FIG. 16 is shown in FIG. 17.

In FIG. 16, numeral 250 denotes a first NPN bipolar transistor having a collector connected to a power supply terminal 240 and an emitter connected to an output terminal 243, numeral 251 denotes a second NPN bipolar transistor having a collector connected to the output terminal 253 and an emitter connected to a fixed potential terminal at a ground potential, numerals 241 and 242 denote input terminals, numerals 244 and 245 denote first and second PMOS transistors having gates connected to the input terminals 242 and 241, respectively, and sources and drains connected in parallel across the collector and the base of the first NPN 250, numerals 246 and 247 denote first and second NMOS transistors having gates connected to the input terminals 241 and 242, respectively, and drains and sources connected in series across the collector and the base of the second NPN 251, numeral 248 denotes a third NMOS transistor having a gate connected to the power supply terminal 240 and a drain and a source connected to the base and the emitter of the first NPN 250, and numeral 249 denotes a fourth NMOS transistor having a gate connected to the power supply terminal 240 and a drain and a source connected to the base and the emitter of the second NPN 251.

Table 1 shows a logic operation of the circuit shown in FIG. 16.

TABLE 1

| Input 241, 242 | PMOS 244, 245 | NMOS 246, 247 | NPN 250 | NPN 251 | Output 243 |
|---|---|---|---|---|---|
| Either one is "0" | Either one is ON | Either one is OFF | ON | OFF | "1" |
| Both are "0" | Both are ON | Both are OFF | ON | OFF | "1" |
| Both are "1" | Both are OFF | Both are ON | OFF | ON | "0" |

When one of the inputs 241 and 242 is at the "0" level, one of the first and second PMOS's 244 and 245 is ON and one of the first and second NMOS's 246 and 247 is OFF. Accordingly, the base potential of the first NPN 250 rises to turn on the first NPN 250, and the second NPN 251 is turned off because the base and the emitter are shorted by the fourth NMOS 249 which is in the non-saturation region. Thus, the emitter current of the first NPN 250 charges the load and the output 243 assumes the "1" level.

When both the inputs 241 and 242 are at the "0" level, both the first and second PMOS's 244 and 245 are turned on and both the first and second NMOS's 246 and 247 are turned off. Accordingly, the operation is same as above and the output 243 assumes the "1" level.

When both the inputs 241 and 242 are at the "1" level, both the first and second PMOS's 244 and 245 are turned off and both the first and second NMOS's 246 and 247 are turned on. Accordingly, the first NPN 250 is turned off because the base and the emitter are shorted by the NMOS 248 which is in the non-saturation region, and since the collector and the base of the second NPN 251 are shorted through the first and second NMOS's 246 and 247, a current is supplied from the output 243 to the base of the second NPN 251 so that the second NPN is turned on and the output 243 assumes the "0" level.

In the turned-on second NPN transistor 251, a forward voltage drop, of the order of usually 0.7–0.8 V, is developed between the base and the emitter for maintaining the ON-state. The base of the second NPN 251 is connected to the source of the second NMOS 247. Thus, the source potential of the second NMOS 247 is higher than the emitter potential of the second NPN 251 by the above-mentioned forward voltage drop. Since the substrate of the NMOS 247 is fixed at the ground potential which is at the same potential as the emitter, the source potential of the NMOS 247 is made higher than the substrate potential by the forward voltage drop. Thus, the NMOS 247 operates in a state under substrate bias. The source of the first NMOS 246 is connected to the base of the second NPN 251 through the second NMOS 247, and has a source potential still higher than the base potential of the second NPN 251 by the ON voltage of the second NMOS 247. Thus, the first NMOS operates under a more intense substrate bias than the second NMOS 247.

The third and fourth NMOS's 248 and 249 may be resistors.

In FIG. 17, a symbol ⊠ indicates a contact, a broken line shows a first wiring, a symbol ⊡ indicates a through-hole and a chain line shows a second wiring. Element numbers are shown in the gate electrodes to facilitate the correspondence to FIG. 16.

A P+ region 223 for forming the PMOS transistor and a collector region 224, a base region 225 and an emitter region 226 for the NPN bipolar transistor are formed in an N well region 221 on the P-type semiconductor substrate. Thus, the PMOS transistors 244 and 245 and the NPN bipolar transistor 250 are formed in the N well region 221. By applying it to a circuit which maintains the potential of the collector region 224 at the power supply potential Vcc, the potential of the substrate (N well region) of the PMOS transistors 244 and 245 is fixed by the collector potential of the NPN bipolar transistor 250 in order to attain the integration. A collector region 227, a base region 228 and an emitter region 229 for forming the NPN bipolar transistor 251 are formed in the N well region 222. It may be applied to a circuit in which the potential of the collector region 227 changes. An N+ region 230 for forming the NMOS transistors 246 and 247 is formed between the N well regions 221 and 222. Similarly, N+ regions 231 and 232 for forming the NMOS transistors 248 and 249 are formed. A P+ region 233 is formed to fall the potential of the P regions to the ground potential. Numerals 235 and 236 denote gate electrodes such as poly-silicon of the PMOS transistors 244 and 245 and the NMOS transistors 246 and 247. Numeral 234 denotes gate electrodes of the NMOS transistors 248 and 249.

The first wiring 252 serving as the Vcc power supply line is connected to the source of the second PMOS 245 through a contact 253, to the source of the first PMOS 244 through a contact 254, to the collector of the first NPN 250 through a contact 255, and to the gate electrodes 234 of the third and fourth NMOS 248 and 259 through a contact 256. The drains of the first and second PMOS's 244 and 245, the base of the first NPN 250 and the drain of the third NMOS 248 are connected by a first wiring 257 and contacts 259, 258 and 260, respectively. The emitter of the first NPN 250, the source of the third NMOS 248, the drain of the first NMOS 246 and the collector of the second NPN 251 are connected by the first wirings 261 and 262 and the contacts 263, 264, 265, 266 and 277, respectively. The emitter of the first NPN 250 and the collector of the second NPN 251 are connected by the second wiring 268 and the through-holes 269 and 270. If the second wiring 268 is not provided, a sheet resistance of the drain of the first NMOS 246 would be inserted between the emitter of the first NPN 250 and the collector of the second NPN 251 and an operation speed would be reduced. The second wiring 268 is provided to prevent such a speed reduction. The second wiring 268 is on the grid of the second wirings extending in Y direction to minimize the impedance to the automatic wiring operation. The source of the second NMOS 247, the drain of the fourth NMOS 249 and the base of the second NPN 251 are connected by the first wiring 271 and the contacts 272, 273 and 274; respectively. The first wiring 275 serving as the ground potential line is connected to the source of the fourth NMOS 249 and the emitter of the second NPN 251 through the contacts 276 and 277, respectively. The P substrate 1 is fixed to the ground potential by the contact 278.

The first wirings 252 and 275 used as the power supply lines have large widths, and the first wirings 261 and 262 and the second wiring 268 through which emitter currents which are as $h_{FE}$ times as large as base currents flow have larger widths than the first wirings 257 and 271 through which the base currents flow. Namely, the base wirings are of the minimum line width in the process.

The contacts 253, 254, 266 and 272 are pairs in order to reduce the contact resistance and the sheet resistivity of the drains or sources of the MOS transistors and increase the operation speed. In this manner, the two-input NAND circuit is constructed.

For LSI, there are known several basic logic circuits. High grade functions can be obtained by combining these basic logic circuits. Applicants' FIGS. 16 and 17 show a specific example of a NAND circuit, which is one of the basic logic circuits, adapted to the BiCMOS device. In this NAND, NMOS transistors 246 and 247 are connected in series and further connected to the base of the bipolar transistor 251. Therefore, there are generated voltage differences between the substrate (P-well) and the source of the respective NMOS transistors. Because of this voltage difference, the threshold voltage Vth is increased to have a large influence on the circuit function. This voltage difference between the source and the substrate is inevitable as long as the MOS transistor are connected in series. From the viewpoint of device structure, efforts for suppressing the effects of this substrate bias are desirable.

To this end, the problem of the above substrate bias is now taken into consideration to realize a high-speed operation of the BiCMOS logic circuit.

As shown in the embodiment of FIG. 16, the BiCMOS logic circuit comprises a logic formed of a CMOS circuit and bipolar transistors connected in totem pole fashion in integral form. The bipolar transistors perform a complementary operation like the CMOS logic circuit, thereby providing low power consumption and high-speed bipolar transistors. Therefore, high-speed operation of the bipolar transistors is indispensable for realizing the speeding-up of the BiCMOS logic circuit.

The characteristics of the bipolar transistors are determined mainly by the vertical structure. As specified in FIGS. 9, 12 and 13, the thickness of the collector layer formed of N-type low concentration layer 50 and N-type high concentration buried layer 2 needs to be thin. To achieve this, the low concentration layer 50 must have a thickness which is relatively thin to permit the high-concentration buried layer 2 to be closer to the surface of the substrate.

Figure 20:
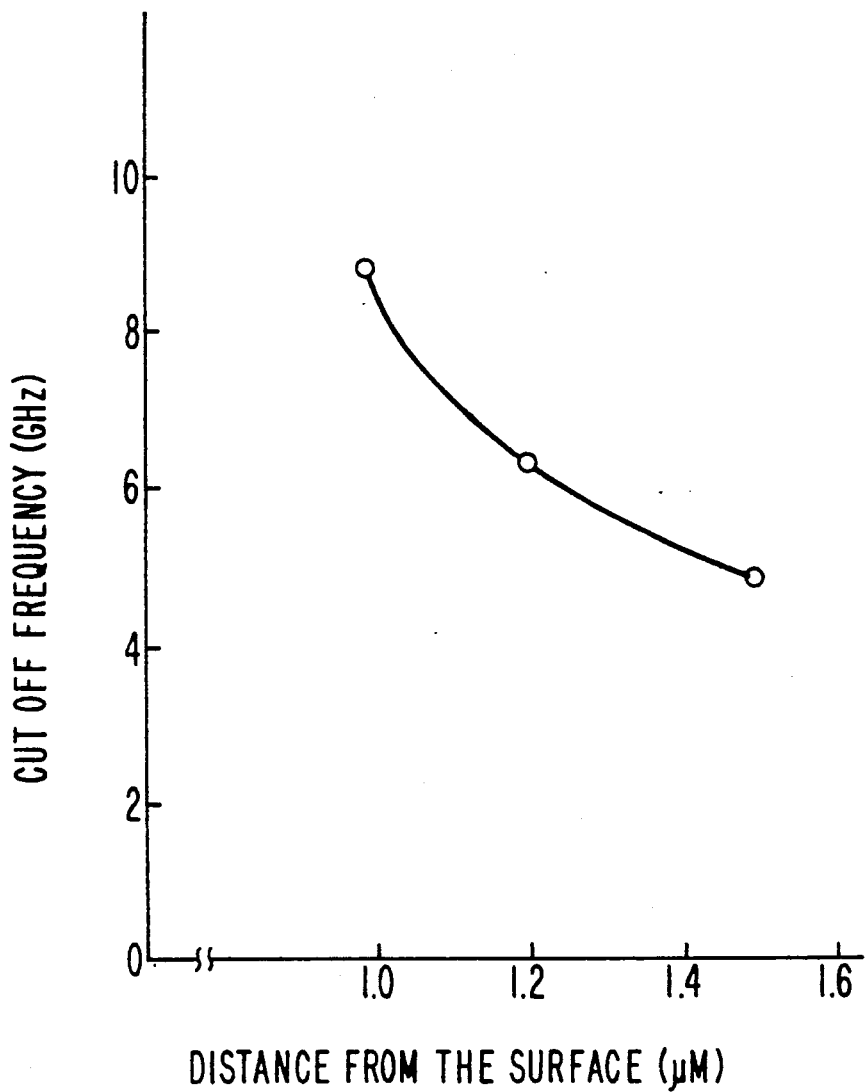

FIG. 20 shows a result of actual measurements on the relation between the position of the high-concentration buried layer 2 and the cutoff frequency fT representing high-speed drivability of the bipolar transistors, where the position of the high-concentration buried layer 2 is indicated by the distance from the surface of the substrate with respect to the peak concentration position of the buried layer 2. In the curve in FIG. 20, a short distance means that the low concentration layer of the collector becomes thin, and it is seen that the thinner the collector is the higher the cutoff frequency fT is, thereby providing high-speed bipolar transistors.

In this manner, it is found that the high-concentration buried layer 2 needs to be located closer to the surface of the substrate to realize high-speed operation of the bipolar transistors. However, another problem arises in that the high-concentration buried layers 40 and 2 provided in the wells for NMOS 61 and PMOS 62, respectively, are simultaneously rendered to be close to the surface. This problem is due to the fact that in the fabrication processes shown in FIGS. 12a and 15e, layers of different thicknesses for NMOS, PMOS and bipolar transistors cannot be realized by the current epitaxial growth method. To overcome the problem, development of a device structure is needed which does not degrade the CMOS device characteristics even with closeness of the high-concentration buried layers 40 and 2 to the surface.

Figure 21:
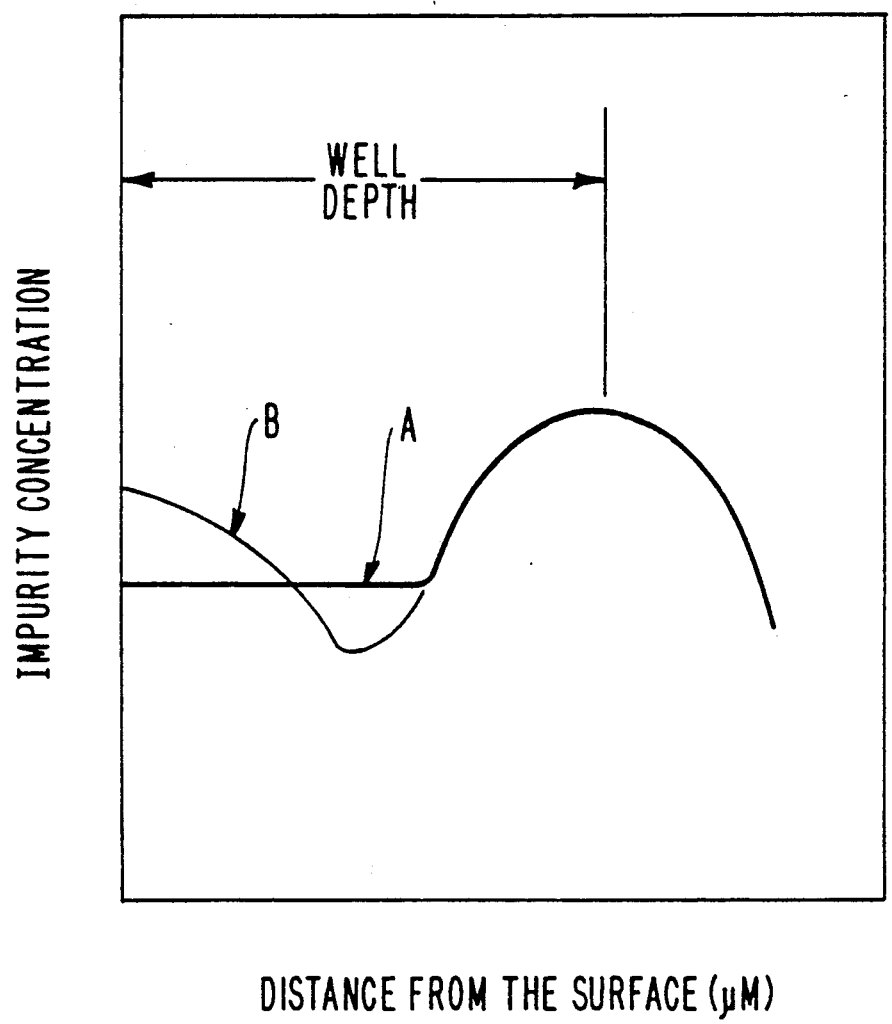

FIG. 21 shows a schematic diagram of two kinds of well structures under test. The structure A has a substantially constant concentration in the vicinity of the surface and has a high-concentration buried layer therein. The structure B has an impurity concentration which decreases gradually as the location becomes remote from the surface in the vicinity of the surface, and is a well structure in which a combination of the well and the buried layer forms a minimum point. The structure A indicates a well including N-layer 10 and the N-buried layer 2 in the PMOS portion 62 in the prior art structure of FIG. 4. The structure B is a well as shown in FIGS. 10a and 10b.

Figure 22:
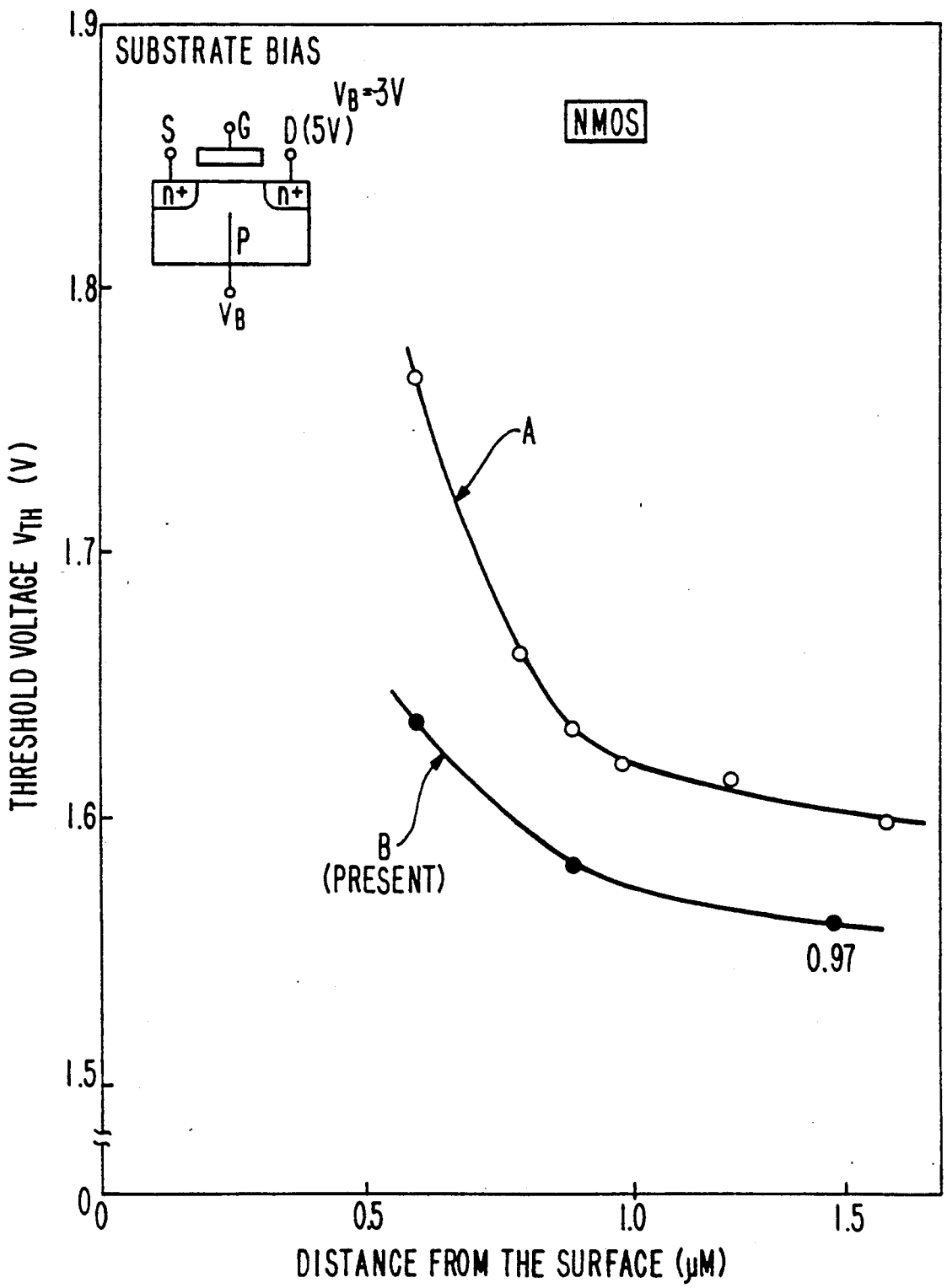

FIG. 22 shows a result of evaluation of the relation between the threshold voltage Vth and the distance of the high concentration buried layer from the surface of a well-structure MOS device as to the respective structures A and B in an NMOS in a trial, and FIG. 23 shows a result of like evaluation as to the structures in a PMOS, where the threshold voltage Vth was evaluated under application of a substrate bias in an operation of the above-mentioned BiMOS logic circuit in FIG. 16. The impurity concentration in the well is so set that the threshold voltage in the absence of the substrate bias is almost the same for the structure A and the structure B. From the diagrams of FIGS. 22 and 23, the threshold voltage Vth with a substrate bias being applied was found to be smaller for the structure B than for the structure A. When the threshold voltage is high, the drain current in the MOS is small and hence the speed of the circuit is reduced. Thus, a lower threshold voltage is desirable. In another view, this experimental result reveals that the structure B allows the buried layer to be closer than the structure A in the case where it has a threshold voltage below a predetermined value in fabricating a CMOS. Accordingly, the structure B is a well structure which provides on-chip high-speed operation bipolar transistors.

For example, if the threshold voltage should be below 1.6 volts, the highly doped embedded region should be separated from the surface more than 1.5 microns in N-MOS and more than 1.3 microns in P-MOS, according to the structure A. In the structure B, however, the highly doped embedded region can be brought nearer to the surface up to 0.8 microns in either N-MOS and P-MOS. This means that according to the structure B the well can have a depth about a half of that of the structure A, in either N-MOS and P-MOS. The structure B is thus very suited for increasing the cut-off frequency fT of the bipolar transistor, especially in cases where substrate bias is applied.

As is clear from the foregoing, as a result of having considered the well structure of CMOS device, a novel finding was demonstrated that the speeding-up of bipolar transistors can be realized without degrading the CMOS device characteristics, by employing a well structure having a minimum impurity concentration at a location internally from the substrate surface to both of the NMOS and PMOS. Thus, according to the present invention, a BiCMOS device including bipolar transistors and a CMOS device in on-chip structure, is formed to include all the elements of the device within a specified profile as exhibited by the structure B in order to provide a high-speed operation logic circuit in which high-speed bipolar transistors and a CMOS device coexist.

According to the first, second and third embodiments of the present invention, the N well region formed on the P⁻-type semiconductor substrate through the N⁺ buried region can be isolated from the P⁻-type semiconductor substrate without the isolating P⁺-layer diffusion layer which is required in the prior art structure. Thus, by forming the PMOS transistors in the N well region, the highly integrated CMOS LSI is provided, and by forming the NPN transistors is the N well region, the highly integrated and high speed composite LSI containing high speed bipolar elements of low collector resistance because of the presence of the N⁺ buried region is provided.

In the CMOS area, since the well resistance is reduced by the presence of the N⁺ and P⁺ buried regions the latch-up due to the parasitic thyristor which is inherent to the CMOS is prevented. Further, because of the N well having the N⁺ buried region, the drain depletion layer of the PMOS does not punch through the P⁻-type silicon substrate even if the well layer is thin. Therefore, the operation speed of the NPN transistor can be further increased.

While the PMOS transistors, the NMOS transistors and the NPN transistors are formed on the same substrate in the embodiments of the present invention, the present invention is not limited thereto but it is applicable to semiconductor integrated circuit devices in which the NMOS transistor 61 a resistor 65 and the NPN transistor 70 are present as shown in a fourth embodiment of the present invention of FIG. 18, the NMOS transistor 61, a lateral PNP transistor 72 and an NPN transistor 73 with a Schottky barrier diode are present as shown in a fifth embodiment of the present invention of FIG. 19, and semiconductor elements having the well (island) regions of the opposite conductivity types such as the vertical NPN transistor and the vertical PNP transistor, the lateral NPN transistor and the vertical PNP transistor, the vertical NPN transistor and the lateral NPN transistor, and the PNPN thyristor, the vertical PNP transistor, the resistor and the capacitor are formed on one substrate.

The present invention is also applicable to the semiconductor integrated circuit devices of the opposite conductivity types to those described above.

The present invention is not limited to the illustrated embodiments but various modifications may be made within the spirit of the present invention.

As described hereinabove, the present invention provides the semiconductor integrated circuit device which has a high integration density and in which the semiconductor elements having the well regions of different conductivity types are well isolated.

We claim:

1. A semiconductor integrated circuit device having a bipolar transistor and complementary MOS transistors, comprising:

a semiconductor layer of a predetermined conductivity type formed on a semiconductor substrate of a predetermined conductivity type;

one or more first well regions of a second conductivity type formed at a predetermined position of a surface of said semiconductor layer, an impurity concentration of said first well regions gradually decreasing as it goes from the surface of said semiconductor layer toward said semiconductor substrate;

a second well region of a first conductivity type formed in contact with said first well regions at the surface of said semiconductor layer and to surround said first well regions, an impurity concentration of said second well region gradually decreasing at it goes from the surface of said semiconductor layer toward said semiconductor substrate;

one or more first buried regions of the second conductivity type formed between said first well regions and said semiconductor substrate and adjacent to said first well region, said first buried regions having a higher impurity concentration than an adjacent area of adjacent first well regions;

a second buried region of the first conductivity type formed between said second well region and said semiconductor substrate and adjacent to said second well region, said second buried region having a higher impurity concentration than an adjacent area of the adjacent second well region; at least one vertical bipolar transistor formed in one of said first well regions;

at least one MOS transistor of the first conductivity type formed in one of said first well regions; and at least one MOS transistor of the second conductivity type formed in said second well region, wherein a source-drain path of at least one of said MOS transistors of said first conductivity type or said second conductivity type is connected between the base and collector of the vertical bipolar transistor.

2. A semiconductor integrated circuit device according to claim 1, wherein said semiconductor layer of said predetermined conductivity type is a semiconductor layer of the second conductivity type.

3. A semiconductor integrated circuit device according to claim 1, wherein said semiconductor layer of said predetermined conductivity type is a semiconductor layer having a substantially uniform impurity concentration distribution.

4. A semiconductor integrated circuit device having a bipolar transistor and complementary MOS transistors, comprising:

a semiconductor layer of a predetermined conductivity type formed on a semiconductor substrate of a predetermined conductivity type;

one or more first well regions of a second conductivity type formed at a predetermined position of a surface of said semiconductor layer, an impurity concentration of said first well regions gradually decreasing as it goes from the surface of said semiconductor layer toward said semiconductor substrate;

a second well region of a first conductivity type formed at a different position from that of said first well regions at the surface of said semiconductor layer, an impurity concentration of said second well region gradually decreasing as it goes from the surface of said semiconductor layer toward said semiconductor substrate;

one or more first buried regions of the second conductivity type formed between said first well regions and said semiconductor substrate and adjacent to said first well region, said first buried regions having a higher impurity concentration than an adjacent area of adjacent first well regions;

a second buried region of the first conductivity type formed between said second well region and said semiconductor substrate and in substantial contact with said first buried region to surround said first buried region, said second buried region having a higher impurity concentration than an adjacent area of the adjacent second well region;

at least one vertical bipolar transistor formed in one of said first well regions;

at least one MOS transistor of the first conductivity type formed in one of said first well regions; and at least one MOS transistor of the second conductivity type formed in said second well region, wherein a source-drain path of at least one of said MOS transistors of said first conductivity type or said second conductivity type is connected between the base and collector of the vertical bipolar transistor.

5. A semiconductor integrated circuit device according to claim 4, wherein said semiconductor layer of said predetermined conductivity type is a semiconductor layer of the second conductivity type.

6. A semiconductor integrated circuit device according to claim 4, wherein said semiconductor layer of said predetermined conductivity type is a semiconductor layer having a substantially uniform impurity concentration distribution.

7. A semiconductor integrated circuit device according to claim 4, wherein said second well region is formed in contact with said first well region to surround said first well region.

8. A semiconductor integrated circuit device according to claim 7, wherein a boundary plane of said first well region and said second well region and a boundary plane of said first buried region and said second buried region are in substantially the same plane.

9. A semiconductor integrated circuit device having a bipolar transistor and complementary MOS transistors, comprising:

a semiconductor substrate of a predetermined conductivity type;

one or more first regions of a second conductivity type formed at a predetermined position above a first surface of said semiconductor substrate, an impurity concentration of said first regions gradually decreasing as it goes from a first surface of said first regions toward said first surface of said semiconductor substrate;

a second region of a first conductivity type formed at a different position from that of said first regions above the first surface of said semiconductor substrate, an impurity concentration of said second region gradually decreasing as it goes from a first surface of said second region toward said first surface of said semiconductor substrate;

one or more third regions of the second conductivity type formed between said first regions and said first surface of said semiconductor substrate and adjacent to said first regions, said third regions having a higher impurity concentration than an adjacent area of adjacent first regions;

a fourth region of the first conductivity type formed between said second region and said first surface of said semiconductor substrate and adjacent to said second region, said fourth region having a higher impurity concentration than an adjacent area of the adjacent second region;

at least one vertical bipolar transistor formed in one of said first regions;

at least one MOS transistor of the first conductivity type formed in one of said first regions; and at least one MOS transistor of the second conductivity type formed in said second region, wherein a source-drain path of at least one of said MOS transistors of said first conductivity type or said second conductivity type is connected between the base and collector of the vertical bipolar transistor.

10. A semiconductor integrated circuit device having a bipolar transistor and complementary MOS transistors, comprising:

a semiconductor substrate of a predetermined conductivity type;

a first region of a second conductivity type formed at a predetermined position above a first surface of said semiconductor substrate, an impurity concentration of said first region gradually decreasing as it goes from a first surface of said first region toward said first surface of said semiconductor substrate;

a second region of a first conductivity type formed at a different position from that of said first region above the first surface of said semiconductor substrate, an impurity concentration of said second region gradually decreasing as it goes from a first surface of said second region toward said first surface of said semiconductor substrate;

a third region of the second conductivity type formed between said first region and said first surface of said semiconductor substrate and adjacent to said first region, said third region having a higher impurity concentration than an adjacent area of adjacent first region;

a fourth region of the first conductivity type formed between said second region and said first surface of said semiconductor substrate and adjacent to said second region, said fourth region having a higher impurity concentration than an adjacent area of the adjacent second region;

a fifth region of the second conductivity type formed at a different position from that of either said first or second regions above said first surface of said semiconductor substrate, an impurity concentration of said fifth region gradually decreasing as it goes from a first surface of said fifth region toward said first surface of said semiconductor substrate;

a sixth region of the second conductivity type formed between said fifth region and said first surface of said semiconductor substrate and adjacent to said fifth region, said sixth region having a higher impurity concentration than an adjacent area of the adjacent fifth region;

at least one vertical bipolar transistor formed in said first region;

at least one MOS transistor of the first conductivity type formed in said fifth region; and at least one MOS transistor of the second conductivity type formed in said second region, wherein a source-drain path of at least one of said MOS transistors of said first conductivity type or said second conductivity type is connected between the base and collector of the vertical bipolar transistor.

11. A semiconductor integrated circuit device according to claim 9, wherein said second region is in contact with and surrounds said at least one first region above the first surface of said substrate.

12. A semiconductor integrated circuit device according to claim 9, wherein said fourth region is in contact with and surrounds said third region adjacent to said first surface of said substrate.

13. A semiconductor integrated circuit device according to claim 10, wherein said second region is in contact with and surrounds said first region above the first surface of said substrate.

14. A semiconductor integrated circuit device according to claim 10, wherein said fourth region is in contact with and surrounds said third region adjacent to said first surface of said substrate.

15. A semiconductor integrated circuit device having a bipolar transistor and complementary MOS transistors, comprising:

a semiconductor layer of a predetermined conductivity type formed on a semiconductor substrate of a predetermined conductivity type;

a first well region of a second conductivity type formed at a predetermined position of a surface of said semiconductor layer, an impurity concentration of said first well region gradually decreasing as it goes from the surface of said semiconductor layer toward said semiconductor substrate;

a second well region of a first conductivity type formed in contact with said first well region at the surface of said semiconductor layer and to surround said first well region, an impurity concentration of said second well region gradually decreasing as it goes from the surface of said semiconductor layer toward said semiconductor substrate;

a first buried region of the second conductivity type formed between said first well region and said semiconductor substrate and adjacent to said first well region, said first buried region having a higher impurity concentration than an adjacent area of the adjacent first well region;

a second buried region of the first conductivity type formed between said second well region and said semiconductor substrate and adjacent to said second well region, said second buried region having a higher impurity concentration than an adjacent area of the adjacent second well region;

a third well region of a second conductivity type formed at a predetermined position of a surface of said semiconductor layer, an impurity concentration of said third well region gradually decreasing as it goes from the surface of said semiconductor layer toward said semiconductor substrate;

a third buried region of the second conductivity type formed between said third well region and said semiconductor substrate and adjacent to said third well region, said third buried region having a higher impurity concentration than an adjacent area of the adjacent third well region;

at least one vertical bipolar transistor formed in said first well region;

at least one MOS transistor of the first conductivity type formed in said third well region; and at least one MOS transistor of the second conductivity type formed in said second well region, wherein a source-drain path of at least one of said MOS transistors of said first conductivity type or said second conductivity type is connected between the base and collector of the vertical bipolar transistor.

16. A semiconductor integrated circuit device according to claim 15, wherein said semiconductor layer of said predetermined conductivity type is a semiconductor layer of the second conductivity type.

17. A semiconductor integrated circuit device according to claim 15, wherein said semiconductor layer of said predetermined conductivity type is a semiconductor layer having a substantially uniform impurity concentration distribution.

18. A semiconductor integrated circuit device having a bipolar transistor and complementary MOS transistors, comprising:

a semiconductor layer of a predetermined conductivity type formed on a semiconductor substrate of a predetermined conductivity type;

a first well region of a second conductivity type formed at a predetermined position of a surface of said semiconductor layer, an impurity concentration of said first well region gradually decreasing as it goes from the surface of said semiconductor layer toward said semiconductor substrate;

a second well region of a first conductivity type formed at a different position from that of said first well region at the surface of said semiconductor, an impurity concentration of said second well region gradually decreasing as it goes from the surface of said semiconductor layer toward said semiconductor substrate;

a first buried region of the second conductivity type formed between said first well region and said semiconductor substrate and adjacent to said first well region, said first buried region having a higher impurity concentration than an adjacent area of the adjacent first well region;

a second buried region of the first conductivity type formed between said second well region and said semiconductor substrate and in substantial contact with said first buried region to surround said first buried region, said second buried region having a higher impurity concentration than an adjacent area of the adjacent second well region;

a third well region of a second conductivity type formed at a predetermined position of a surface of said semiconductor layer, an impurity concentration of said third well region gradually decreasing as it goes from the surface of said semiconductor layer toward said semiconductor substrate;

a third buried region of the second conductivity type formed between said third well region and said semiconductor substrate and adjacent to said third well region, said third buried region having a higher impurity concentration than an adjacent area of the adjacent third well region;

at least one vertical bipolar transistor formed in said first well region;

at least one MOS transistor of the first conductivity type formed in said third well region; and at least one MOS transistor of the second conductivity type formed in said second well region, wherein a source-drain path of at least one of said MOS transistors of said first conductivity type or said second conductivity type is connected between the base and collector of the vertical bipolar transistor.

19. A semiconductor integrated circuit device according to claim 18, wherein said second well region is formed in contact with said first well region to surround said first well region.

20. A semiconductor integrated circuit device according to claim 18, wherein said semiconductor layer of said predetermined conductivity type is a semiconductor layer of the second conductivity type.

21. A semiconductor integrated circuit device according to claim 18, wherein said semiconductor layer of said predetermined conductivity type is a semiconductor layer having a substantially uniform impurity concentration distribution.

22. A semiconductor integrated circuit device according to claim 19, wherein a boundary plane of said first well region and said second well region and a boundary plane of said first buried region and said second buried region are in substantially the same plane.

23. A semiconductor integrated circuit device having a bipolar transistor and complementary MOS transistors, comprising:

a semiconductor substrate having a first and a second surface;

a substrate region of a predetermined conductivity type formed at a predetermined position of the second surface;

one or more first regions of a second conductivity type formed at a predetermined position of the first surface of said semiconductor substrate, an impurity concentration of said first regions gradually decreasing as it goes from the first surface of said semiconductor substrate toward the second surface of said semiconductor substrate;

a second region of a first conductivity type formed at a different position of the first surface of said semiconductor substrate from that of said first regions, an impurity concentration of said second region gradually decreasing as it goes from the first surface of said semiconductor substrate toward the second surface of said semiconductor substrate;

one or more regions of the second conductivity type formed between said first regions and said substrate region and adjacent to said first regions, said third regions having a higher impurity concentration than an adjacent area of adjacent first regions;

a fourth region of the first conductivity type formed between said second region and said substrate region and adjacent to said second region, said fourth region having a higher impurity concentration than an adjacent area of the adjacent second region;

a vertical bipolar transistor formed in one of said first regions;

a MOS transistor of the first conductivity type formed in one of said first regions; and a MOS transistor of the second conductivity type formed in said second region, wherein a source-drain path of at least one of said MOS transistors of said first conductivity type or said second conductivity type is connected between the base and collector of the vertical bipolar transistor.

24. A semiconductor integrated circuit device having a bipolar transistor and complementary MOS transistors, comprising:

a semiconductor substrate having a first and a second surface;

a substrate region of a predetermined conductivity type formed at a predetermined position of the second surface;

a first region of a second conductivity type formed at a predetermined position above a first surface of said semiconductor substrate, an impurity concentration of said first region gradually decreasing as it goes from the first surface of said semiconductor substrate toward the second surface of said semiconductor substrate;

a second region of a first conductivity type formed at a different position of the first surface of said semiconductor substrate from that of said first region, an impurity concentration of said second region gradually decreasing as it goes from a first surface of said semiconductor substrate toward the second surface of said semiconductor substrate;

a third region of the second conductivity type formed between said first region and said substrate region and adjacent to said first region, said third region having a higher impurity concentration than an adjacent area of adjacent first region;

a fourth region of the first conductivity type formed between said second region and said substrate region and adjacent to said second region, said fourth region having a higher impurity concentration than an adjacent area of the adjacent second region;

a fifth region of the second conductivity type formed at a different position of the first surface of said semiconductor substrate from that of either said first or second region, an impurity concentration of said fifth region gradually decreasing as it goes from a first surface of said semiconductor substrate toward the second surface of said semiconductor substrate;

a sixth region of the second conductivity type formed between said fifth region and said substrate region and adjacent to said fifth region, said sixth region having a higher impurity concentration than an adjacent area of the adjacent fifth region;

a vertical bipolar transistor formed in said first region;

a MOS transistor of the first conductivity type formed in said fifth region; and a MOS transistor of the second conductivity type formed in said second region, wherein a source-drain path of at least one of said MOS transistors of said first conductivity type or said second conductivity type is connected between the base and collector of the vertical bipolar transistor.

25. A semiconductor integrated circuit device according to claim 1, wherein said vertical bipolar transistor and said MOS transistor of the first conductivity type are formed in different first well regions.

26. A semiconductor integrated circuit device according to claim 4, wherein said vertical bipolar transistor and said MOS transistor of the first conductivity type are formed in different first well regions.

27. A semiconductor integrated circuit device according to claim 9, wherein said vertical bipolar transistor and said MOS transistor of the first conductivity type are formed in different first regions.

28. A semiconductor integrated circuit device according to claim 23, wherein said vertical bipolar transistor and said MOS transistor of the first conductivity type are formed in different first regions.

29. A semiconductor integrated circuit device according to claim 1, wherein the semiconductor substrate is the first conductivity type.

30. A semiconductor integrated circuit device according to claim 4, wherein the semiconductor substrate is the first conductivity type.

31. A semiconductor integrated circuit device according to claim 9, wherein the semiconductor substrate is the first conductivity type.

32. A semiconductor integrated circuit device according to claim 10, wherein the semiconductor substrate is the first conductivity type.

33. A semiconductor integrated circuit device according to claim 15, wherein the semiconductor substrate is the first conductivity type.

34. A semiconductor integrated circuit device according to claim 18, wherein the semiconductor substrate is the first conductivity type.

35. A semiconductor integrated circuit device according to claim 23, wherein the semiconductor substrate is the first conductivity type.

36. A semiconductor integrated circuit device according to claim 24, wherein the semiconductor substrate is the first conductivity type.

37. A semiconductor integrated circuit device according to claim 1, further comprising at least another vertical bipolar transistor formed in another of said first well regions.

38. A semiconductor integrated circuit device according to claim 4, further comprising at least another vertical bipolar transistor formed in another of said first well regions.

39. A semiconductor integrated circuit device according to claim 9, further comprising at least another vertical bipolar transistor formed in another of said first well regions.

40. A semiconductor integrated circuit device according to claim 10, wherein an additional first region and an additional third region are provided, said semiconductor integrated circuit device further comprising at least another vertical bipolar transistor formed in said additional first region.

41. A semiconductor integrated circuit device according to claim 15, wherein an addition first well region and an additional first buried region are provided, said semiconductor integrated circuit further comprising at least another vertical bipolar transistor formed in said additional first well region.

42. A semiconductor integrated circuit device according to claim 18, wherein an addition first well region and an additional first buried region are provided, said semiconductor integrated circuit further comprising at least another vertical bipolar transistor formed in said additional first well region.

43. A semiconductor integrated circuit device according to claim 23, further comprising at least another vertical bipolar transistor formed in another of said first regions.

44. A semiconductor integrated circuit device according to claim 24, wherein an additional first region and an additional third region are provided, said semiconductor integrated circuit further comprising at least another vertical bipolar transistor formed in said additional first region.

45. A semiconductor integrated circuit device according to claim 1, wherein the second well region surrounds the first well regions and the second buried region surrounds the first buried regions.

46. A semiconductor integrated circuit device according to claim 4, wherein the second well region surrounds the first well regions and the second buried region surrounds the first buried regions.

47. A semiconductor integrated circuit device according to claim 9, wherein the second region surrounds the first regions and the fourth region surrounds the third regions.

48. A semiconductor integrated circuit device according to claim 10, wherein the second region surrounds the first and fifth regions and the fourth region surrounds the third and sixth regions.

49. A semiconductor integrated circuit device according to claim 15, wherein the second well region surrounds the first and third well regions, and wherein the second buried region surrounds the first and third buried regions.

50. A semiconductor integrated circuit device according to claim 18, wherein the second well region surrounds the first and third well regions, and wherein the second buried region surrounds the first and third buried regions.

51. A semiconductor integrated circuit device according to claim 23, wherein the second region surrounds the first regions and the fourth region surrounds the third regions.

52. A semiconductor integrated circuit device according to claim 24, wherein the second region surrounds the first and fifth regions and the fourth region surrounds the third and sixth regions.

* * * * *